United States Patent
Jo et al.

(10) Patent No.: US 11,894,469 B2
(45) Date of Patent: Feb. 6, 2024

(54) RESONANT TUNNELING DEVICES INCLUDING TWO-DIMENSIONAL SEMICONDUCTOR MATERIALS AND METHODS OF DETECTING PHYSICAL PROPERTIES USING THE SAME

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Sanghyun Jo, Seoul (KR); Heejun Yang, Suwon-si (KR); Hyeonjin Shin, Suwon-si (KR); Shoujun Zheng, Suwon-si (KR)

(73) Assignees: RESEARCH & BUSINESS FOUNDATION SUNGKYUNKWAN UNIVERSITY, Gyeonggi-do (KR); SAMSUNG ELECTRONICS CO., LTD., Gyeonggi-do (KR)

( * ) Notice: Subject to any disclaimer, the term of this patent is extended or adjusted under 35 U.S.C. 154(b) by 811 days.

(21) Appl. No.: 16/811,549

(22) Filed: Mar. 6, 2020

(65) Prior Publication Data
US 2020/0350442 A1    Nov. 5, 2020

(30) Foreign Application Priority Data
Apr. 30, 2019 (KR) .......... 10-2019-0050721

(51) Int. Cl.
*H01L 29/00* (2006.01)
*H01L 29/88* (2006.01)
*H01L 29/267* (2006.01)
*H01L 29/04* (2006.01)
*H01L 29/06* (2006.01)
(Continued)

(52) U.S. Cl.
CPC .......... *H01L 29/882* (2013.01); *H01L 29/045* (2013.01); *H01L 29/0657* (2013.01); *H01L 29/1606* (2013.01); *H01L 29/24* (2013.01); *H01L 29/267* (2013.01);
(Continued)

(58) Field of Classification Search
CPC ..... H01L 29/882; H01L 29/045; H01L 29/24; H01L 29/267
See application file for complete search history.

(56) References Cited

U.S. PATENT DOCUMENTS

| | | |
|---|---|---|
| 2004/0175595 A1 | 9/2004 | Heath et al. |
| 2015/0014630 A1 | 1/2015 | Choi et al. |

(Continued)

OTHER PUBLICATIONS

Fallahazad, Babak, et al. "Gate-tunable resonant tunneling in double bilayer graphene heterostructures." Nano letters 15.1 (2015): 428-433.
(Continued)

*Primary Examiner* — Reema Patel
(74) *Attorney, Agent, or Firm* — Harness, Dickey & Pierce, P.L.C.

(57) ABSTRACT

A resonant tunneling device includes a first two-dimensional semiconductor layer including a first two-dimensional semiconductor material, a first insulating layer on the first two-dimensional semiconductor layer; and a second two-dimensional semiconductor layer on the first insulating layer and including a second two-dimensional semiconductor material of a same kind as the first two-dimensional semiconductor material.

32 Claims, 18 Drawing Sheets

(51) Int. Cl.
  H01L 29/24    (2006.01)
  H01L 29/417   (2006.01)
  H01L 29/66    (2006.01)
  H01L 31/032   (2006.01)
  H01L 29/16    (2006.01)

(52) U.S. Cl.
  CPC ...... *H01L 29/417* (2013.01); *H01L 29/66977* (2013.01); *H01L 31/032* (2013.01)

(56) References Cited

U.S. PATENT DOCUMENTS

2016/0359062 A1   12/2016   Heo et al.
2017/0098716 A1   4/2017    Li et al.

OTHER PUBLICATIONS

Campbell, Philip M., et al. "Enhanced resonant tunneling in symmetric 2D semiconductor vertical heterostructure transistors." ACS nano 9.5 (2015): 5000-5008.

Britnell, L., et al. "Resonant tunnelling and negative differential conductance in graphene transistors." Nature communications 4.1 (2013): 1-5.

Wu, Xian, et al. "Full-band simulations of single-particle resonant tunneling in transition metal dichalcogenide-based interlayer tunneling field-effect transistors." 2016 International Conference on Simulation of Semiconductor Processes and Devices (SISPAD). IEEE, 2016: 89-92.

Mishchenko, Artem, et al. "Twist-controlled resonant tunnelling in graphene/boron nitride/graphene heterostructures." Nature nanotechnology 9.10 (2014): 808-813.

Roy, Tania, et al. "Dual-gated MoS2/WSe2 van der Waals tunnel diodes and transistors." ACS nano 9.2 (2015): 2071-2079.

Shim, Jaewoo, et al. "Phosphorene/rhenium disulfide heterojunction-based negative differential resistance device for multi-valued logic." Nature communications 7.1 (2016): 1-8.

Nguyen, Linh-Nam, et al. "Resonant tunneling through discrete quantum states in stacked atomic-layered MoS2." Nano letters 14.5 (2014): 2381-2386.

Extended European Search Report dated Sep. 14, 2020 for corresponding European Application No. 20163954.9.

P. Wang et al. Total Ionizing Dose Effects and Proton-Induced Displacement Damage on $MoS_2$-Interlayer-$MoS_2$ Tunneling Junctions *IEEE Transactions on Nuclear Science*, 2019, vol. 66, No. 1, pp. 420-427.

D. Schulman et al. 'The Prospect of Two-Dimensional Heterostructures: A Review of Recent Breakthroughs' *IEEE Nanotechnology Magazine*, Jun. 2017, pp. 6-17.

M. Li et al. 'Heterostructures based on two-dimensional layered materials and their potential applications' *Materials Today*, vol. 19, No. 6, Jul./Aug. 2016, pp. 322-335.

RESONANT TUNNELING DEVICES INCLUDING TWO-DIMENSIONAL SEMICONDUCTOR MATERIALS AND METHODS OF DETECTING PHYSICAL PROPERTIES USING THE SAME

CROSS-REFERENCE TO RELATED APPLICATION

This application claims the benefit under 35 U.S.C. § 119 of Korean Patent Application No. 10-2019-0050721, filed on Apr. 30, 2019, in the Korean Intellectual Property Office, the disclosure of which is incorporated herein in its entirety by reference.

BACKGROUND

1. Field

The present disclosure relates to resonant tunneling devices including one or more two-dimensional semiconductor materials and methods of detecting physical properties using the resonant tunneling devices.

2. Description of the Related Art

The negative differential resistance (NDR) effect is a phenomenon in which current through a device decreases even though voltage applied to the device increases. The NDR effect is generally found in bulk-type materials having non-linear electrical properties and is applied in various fields such amplifiers, electronic oscillators, digital analog converters, switching circuits, memories, or the like. Meanwhile, the NDR effect has been recently observed in resonant tunneling devices manufactured by bonding two-dimensional materials.

SUMMARY

Provided are resonant tunneling devices including a two-dimensional semiconductor material and methods of detecting physical properties using the resonant tunneling devices.

According to some example embodiments, a resonant tunneling device may include a first two-dimensional semiconductor layer including a first two-dimensional semiconductor material, a first insulating layer on the first two-dimensional semiconductor layer, and a second two-dimensional semiconductor layer on the first insulating layer, the second two-dimensional semiconductor layer including a second two-dimensional semiconductor material of a same kind as the first two-dimensional semiconductor material. A crystal lattice of the first two-dimensional semiconductor material and a crystal lattice of the second two-dimensional semiconductor material may be aligned with each other.

The first two-dimensional semiconductor material and the second two-dimensional semiconductor material may each include transition metal dichalcogenide (TMD).

The TMD may be expressed by <Equation 1>, $$M_{1-a}M'_aX_{2(1-b)}X'_{2b} \quad \text{<Equation 1>}$$

wherein, in <Equation 1>, M and M' are different transition metal elements, X and X' are different chalcogen elements, 0≤a<1, and 0≤b<1.

The different transition metal elements may each include a different at least one of Ti, Zr, Hf, V, Nb, Ta, Mo, W, Tc, Re, Co, Rh, Ir, Ni, Pd, Pt, Zn, or Sn, and the different chalcogen elements may each include a different at least one of S, Se or Te.

The first insulating layer may include a two-dimensional insulating material or an oxide material.

The resonant tunneling device may further include a first electrode electrically connected to the first two-dimensional semiconductor layer, and a second electrode electrically connected to the second two-dimensional semiconductor layer.

The resonant tunneling device may further include a substrate, wherein the first two-dimensional semiconductor layer is on the substrate.

The substrate may include an insulating material.

The resonant tunneling device may further include a second insulating layer, wherein the first two-dimensional semiconductor layer is on the second insulating layer; and a substrate, wherein the second insulating layer is on the substrate and includes an electrically conductive material.

The substrate may serve as a gate electrode, and the second insulating layer may serve as a gate insulating layer.

The resonant tunneling device may further include a graphene layer on at least one of the first two-dimensional semiconductor layer or the second two-dimensional semiconductor layer.

The resonant tunneling device may be configured to detect one or more physical properties of the first two-dimensional semiconductor material and the second two-dimensional semiconductor material based on a negative differential resistance (NDR) effect.

The physical properties may include an electronic structure, a bandgap, or a quantum capacitance.

The resonant tunneling device may be configured to detect a temperature, a wavelength of light or an intensity of light based on the NDR effect.

According to some example embodiments, a method of detecting physical properties using a resonant tunneling device that includes a first two-dimensional semiconductor layer, the first two-dimensional semiconductor layer including a first two-dimensional semiconductor material, a first insulating layer on the first two-dimensional semiconductor layer, and a second two-dimensional semiconductor layer on the first insulating layer and including a second two-dimensional semiconductor material of a same kind as the first two-dimensional semiconductor material, wherein a crystal lattice of the first two-dimensional semiconductor material and a crystal lattice of the second two-dimensional semiconductor material are aligned with each other, may include causing the resonant tunneling device to detect one or more physical properties of the first and second two-dimensional semiconductor materials, based on a negative differential resistance (NDR) effect.

The physical properties may include an electronic structure, a bandgap, or a quantum capacitance.

The physical properties may be the bandgap, and the bandgap may be detected using the NDR effect generated according to a gate voltage in the resonant tunneling device.

According to some example embodiments, a method of detecting physical properties using a resonant tunneling device that includes a first two-dimensional semiconductor layer, the first two-dimensional semiconductor layer including a first two-dimensional semiconductor material; a first insulating layer on the first two-dimensional semiconductor layer; and a second two-dimensional semiconductor layer provided on the first insulating layer and including a second two-dimensional semiconductor material of a same kind as the first two-dimensional semiconductor material, wherein a crystal lattice of the first two-dimensional semiconductor material and a crystal lattice of the second two-dimensional semiconductor material are aligned with each other, may include causing the resonant tunneling device to detect one or more of a temperature, a wavelength of light incident on the resonant tunneling device, or an intensity of the light incident on the resonant tunneling device, based on a negative differential resistance (NDR) effect.

The temperature may be detected using the NDR effect generated according to the temperature in the resonant tunneling device.

The wavelength of the light or the intensity of the light may be detected using the NDR effect generated according to the light incident on the resonant tunneling device.

According to some example embodiments, a resonant tunneling device may include a first two-dimensional semiconductor layer including a first two-dimensional semiconductor material, a first insulating layer on the first two-dimensional semiconductor layer, and a second two-dimensional semiconductor layer on the insulating layer, the second two-dimensional semiconductor layer including a second two-dimensional semiconductor material of a same kind as the first two-dimensional semiconductor material.

A crystal lattice of the first two-dimensional semiconductor material and a crystal lattice of the second two-dimensional semiconductor material may be aligned with each other.

The first two-dimensional semiconductor material and the second two-dimensional semiconductor material may each include transition metal dichalcogenide (TMD).

The TMD may be expressed by <Equation 1>, $$M_{1-a}M_a'X_{2(1-b)}X_{2b}'$$ <Equation 1> wherein, in <Equation 1>, M and M' are different transition metal elements, X and X' are different chalcogen elements, $0 \le a < 1$, and $0 \le b < 1$.

The different transition metal elements may each include a different at least one of Ti, Zr, Hf, V, Nb, Ta, Mo, W, Tc, Re, Co, Rh, Ir, Ni, Pd, Pt, Zn, or Sn, and the different chalcogen elements may each include a different at least one of S, Se or Te.

The first insulating layer may include a two-dimensional insulating material or an oxide material.

The resonant tunneling device may further include a first electrode electrically connected to the first two-dimensional semiconductor layer, and a second electrode electrically connected to the second two-dimensional semiconductor layer.

The resonant tunneling device may further include a substrate, wherein the first two-dimensional semiconductor layer is on the substrate.

The substrate may include an insulating material.

The resonant tunneling device may further include a second insulating layer, wherein the first two-dimensional semiconductor layer is on the second insulating layer; and a substrate, wherein the second insulating layer is on the substrate and includes an electrically conductive material.

The substrate may serve as a gate electrode, and the second insulating layer may serve as a gate insulating layer.

The resonant tunneling device may further include a graphene layer on at least one of the first two-dimensional semiconductor layer or the second two-dimensional semiconductor layer.

A system may include the resonant tunneling device, a power supply, and processing circuitry configured to control an application of voltage to at least one of the first two-dimensional semiconductor layer or the second two-dimensional semiconductor layer of the resonant tunneling device to cause the resonant tunneling device to perform at least one of detecting one or more physical properties of the first and second two-dimensional semiconductor materials, based on a negative differential resistance (NDR) effect, or detecting one or more of a temperature, a wavelength of light incident on the resonant tunneling device, or an intensity of the light incident on the resonant tunneling device, based on a negative differential resistance (NDR) effect.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
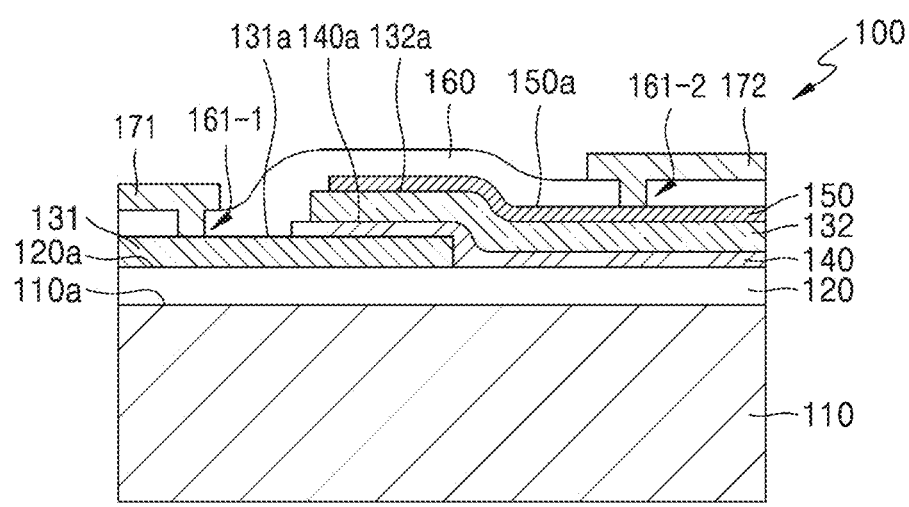
FIG. 1 shows a resonant tunneling device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The use of the terms "a" and "an" and "the" and similar referents in the context of describing the disclosure (especially in the context of the following claims) are to be construed to cover both the singular and the plural. Also, operations of all methods described herein may be performed in any suitable order unless otherwise indicated herein or otherwise clearly contradicted by context. The present disclosure is not limited to the described order of the operations. The use of any and all examples, or language (e.g., "such as") provided herein, is intended merely to better illuminate the disclosure and does not pose a limitation on the scope of the disclosure unless otherwise claimed.

FIG. 1 shows a resonant tunneling device 100 according to some example embodiments. As used herein, a resonant tunneling device may be referred to as a "semiconductor device".

Referring to FIG. 1, the resonant tunneling device 100 may include a substrate 110, a first two-dimensional semiconductor layer 131, a first insulating layer 140, a second two-dimensional semiconductor layer 132 and a graphene layer 150 that are sequentially stacked on the substrate 110. In some example embodiments, the substrate 110 may be omitted.

It will be understood that, as described herein, an element that is "on" another element may be above or beneath the other element. Additionally, an element that is "on" another element may be directly on the other element, such that the element is in direct contact with the other element, or may be indirectly on the other element, such that the element is isolated from direct contact with the other element by one or more interposing spaces and/or structures.

The substrate 110 may include a conductive material, for example an electrically conductive material. In some example embodiments, the substrate 110 may serve as a gate electrode.

The substrate 110 may include a semiconductor material. The semiconductor material may include, for example, a Group IV semiconductor material or a semiconductor compound. As a specific example, the Group IV semiconductor material may include Si, Ge, Sn, or the like. The substrate 110 may include metal. The metal may include, for example, at least one of Cu, Mo, Ni, Al, W, Ru, Co, Mn, Ti, Ta, Au, Hf, Zr, Zn, Y, Cr or Gd. In some example embodiments, the materials of the substrate 110 mentioned above are merely examples, and the substrate 110 may include other various materials. In some example embodiments, the substrate 110 may include an insulating material.

A second insulating layer 120 may be formed on an upper surface 110a of the substrate 110, such that the first two-dimensional semiconductor layer 132 is on the second insulating layer 120 and that the second insulating layer 120 is on the substrate 110. The second insulating layer 120 may serve as a gate insulating layer. The second insulating layer 120 may include, for example, oxide ("an oxide material") or nitride ("a nitride material"), but is not limited thereto. In some example embodiments, the second insulating layer 120 may be omitted from the resonant tunneling device 100.

On an upper surface 120a of the second insulating layer 120, the first two-dimensional semiconductor layer 131 including a first two-dimensional semiconductor material may be provided. It will be understood that the first two-dimensional semiconductor layer 131 is on the substrate 110. Here, the two-dimensional semiconductor material refers to a material having a two-dimensional crystal structure and having a semiconductor property.

The first two-dimensional semiconductor material may include, for example, transition metal dichalcogenide (TMD). TMD is a two-dimensional material having semiconductor properties, and has excellent electrical properties. Even when a thickness of TMD is reduced to nanoscale, its characteristics do not change greatly and TMD has high mobility and thus applied to various devices.

TMD may include two chalcogen atomic layers having a two-dimensional hexagonal honeycomb structure and one metal atomic layer sandwiched between the two chalcogen atomic layers. TMD may be expressed by <Equation 1> as shown below.

$$M_{1-a}M_a'X_{2(1-b)}X_{2b}' \qquad \text{<Equation 1>}$$

In <Equation 1>, M and M' are different transition metal elements, X and X' are different chalcogen elements, $0 \leq a < 1$, and $0 \leq b < 1$.

The different transition metal elements M and M' may each include a different at least one of Ti, Zr, Hf, V, Nb, Ta, Mo, W, Tc, Re, Co, Rh, Ir, Ni, Pd, Pt, Zn, or Sn. The different chalcogen elements X and X' may each include a different at least one of S, Se, or Te. However, the chalcogen element is not limited thereto.

The first insulating layer 140 may be formed on the upper surface 131a of the first two-dimensional semiconductor layer 131, such that the first insulating layer 140 is understood to be on the first two-dimensional semiconductor layer 131. The first insulating layer 140 may include, for example, a two-dimensional insulating material. Here, the two-dimensional semiconductor material means a material having a two-dimensional crystal structure and having an insulating property. The two-dimensional insulating material may include, for example, hexagonal boron nitride (h-BN). In some example embodiments, the two-dimensional insulating material is not limited thereto. In some example embodiments, the first insulating layer 140 may include an insulating material that is different from the two-dimensional insulating material. For example, the first insulating layer 140 may include an oxide material (also referred to herein as simply "oxide") or the like.

A second two-dimensional semiconductor layer 132 including the second two-dimensional semiconductor material may be formed on an upper surface 140a of the first insulating layer 140, such that the second two-dimensional semiconductor layer 132 is on the first insulating layer 140. Here, the second two-dimensional semiconductor material may be a same kind of material as the first two-dimensional semiconductor material described above. It will be understood that a material that is a "same kind" as another material may be a same type, composition, category, or the like of material as the other material. For example, the second two-dimensional semiconductor material may include TMD, such that the first two-dimensional semiconductor layer 131 material and the second two-dimensional semiconductor layer 132 material each include the aforementioned TMD and thus the second two-dimensional semiconductor layer 132 material includes a same kind of material as the first two-dimensional semiconductor layer 131 material.

In some example embodiments, the second two-dimensional semiconductor material may be disposed on the first insulating layer 140 such that a crystal lattice of the first two-dimensional semiconductor material of the first two-dimensional semiconductor layer 131 and a crystal lattice of the second two-dimensional semiconductor material of the second two-dimensional semiconductor layer 132 are aligned with each other. In some example embodiments, two separate crystal lattices are "aligned" with each other where the crystal lattices are at least 90% aligned with each other. In some example embodiments, a crystal lattice of the first two-dimensional semiconductor material of the first two-dimensional semiconductor layer 131 and a crystal lattice of the second two-dimensional semiconductor material of the second two-dimensional semiconductor layer 132 are not aligned with each other (e.g., are more that 10% out of alignment with each other).

Figure 2A:
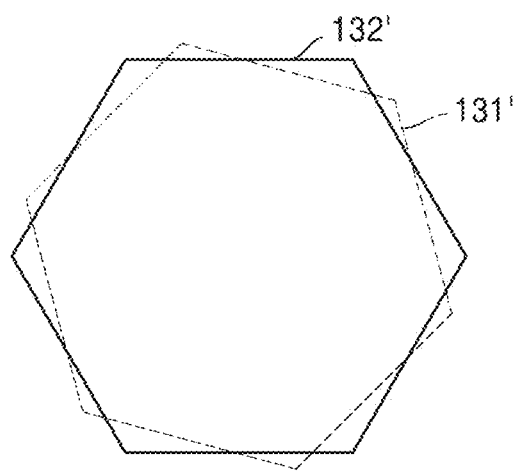
FIG. 2A is a schematic plan view of a state in which a crystal lattice of a first two-dimensional semiconductor material and a crystal lattice of a second two-dimensional semiconductor material are not aligned.
Figure 2B:
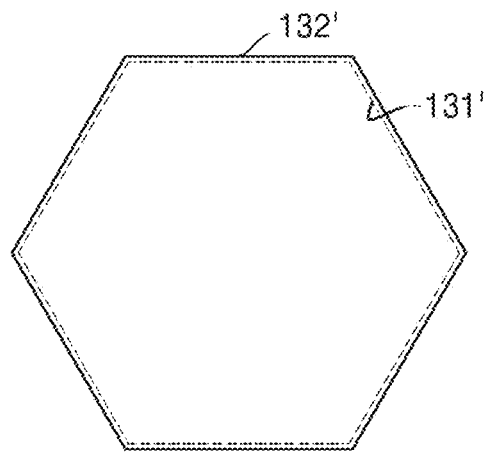
FIG. 2B is a schematic plan view of a state in which a crystal lattice of a first two-dimensional semiconductor material and a crystal lattice of a second two-dimensional semiconductor material are aligned with each other.

FIG. 2A illustrates a state in which a crystal lattice 131' of the first two-dimensional semiconductor material and a crystal lattice 132' of the second two-dimensional semiconductor material are not aligned. Referring to FIG. 2A, the crystal lattice 132' of the second two-dimensional semiconductor material may be twisted by a certain angle with the crystal lattice 131' of the first two-dimensional semiconductor material. In contrast, FIG. 2B illustrates a state in which the crystal lattice 131' of the first two-dimensional semiconductor material and the crystal lattice 132' of the second two-dimensional semiconductor material are aligned with each other.

In some example embodiments, the first and second two-dimensional semiconductor layers 131 and 132 including the first and second two-dimensional semiconductor materials of the same kind may be provided with the first insulating layer 140 therebetween. Here, the crystal lattice 131' of the first two-dimensional semiconductor material and the crystal lattice 132' of the second two-dimensional semiconductor material may be aligned with each other. Here, the alignment of the crystal lattice 131' of the first two-dimensional semiconductor material and the crystal lattice 132' of the second two-dimensional semiconductor material may be performed by using, for example, a transfer method.

By aligning the crystal lattice 131' of the first two-dimensional semiconductor material with the crystal lattice 132' of the second two-dimensional semiconductor material, the resonant tunneling device 100, in which resonant tunneling and a negative differential resistance (NDR) effect more clearly appear, may be manufactured as will be described later. Here, the NDR effect refers to a phenomenon in which current decreases even though voltage applied to a device increases.

The graphene layer 150 including graphene may be provided on an upper surface 132a of the second two-dimensional semiconductor layer 132. Graphene is a material having a two-dimensional crystal structure and having a conductive property. Specifically, graphene is a material having a hexagonal honeycomb structure in which carbon atoms are two-dimensionally connected, and has a very small thickness of an atomic size level. Graphene has high electrical mobility and excellent thermal property, chemical stability, and a wide surface area. In some example embodiments, the graphene layer 150 may facilitate the flow of electrons and holes by easily adjusting the chemical potential of a second electrode 172, which will be described later.

The first two-dimensional semiconductor layer 131 may be electrically connected to a first electrode 171, and the second two-dimensional semiconductor layer 132 may be electrically connected to the second electrode 172 through the graphene layer 150. To this end, a third insulating layer 160 may be formed to cover an upper surface 131a of the first two-dimensional semiconductor layer 131 and an upper surface 150a of the graphene layer 150 exposed to the outside. The first electrode 171 may be formed on the third insulating layer 160 to be connected to the first two-dimensional semiconductor layer 131 through a via hole 161-1 formed in the third insulating layer 160. The second electrode 172 may be provided on the third insulating layer 160 and be connected to the graphene layer 150 through another via hole 161-2 formed in the third insulating layer 160. It will be understood that, in some example embodiments, the third insulating layer 160 may be omitted from the resonant tunneling device 100.

The first electrode 171 may be a source electrode, and the second electrode 172 may be a drain electrode. The first and second electrodes 171 and 172 may include, for example, metal having excellent conductivity. Here, the metal may include at least one of Cu, Mo, Ni, Al, W, Ru, Co, Mn, Ti, Ta, Au, Hf, Zr, Zn, Y, Cr or Gd. However, the metal is not limited thereto.

In some example embodiments, the first electrode 171 and/or the second electrode 172 may be omitted from the resonant tunneling device 100.

FIGS. 3A, 3B, 3C, and 3D illustrate resonant tunneling and an NDR effect according to voltage applied between the first and second electrodes 171 and 172 in the resonant tunneling device 100 according to some example embodiments shown in FIG. 1. Here, $MoS_2$ is used as first and second two-dimensional semiconductor materials, and a crystal lattice of $MoS_2$, which is the first two-dimensional semiconductor material, and a crystal lattice of $MoS_2$, which is the second two-dimensional semiconductor material, are arranged in alignment with each other. In addition, h-BN is used as a material of the first insulating layer 140 provided between the first and second two-dimensional semiconductor layers 131 and 132. Silicon and silicon oxide are used as the substrate 110 and the second insulating layer 120 material, respectively.

In FIGS. 3A through 3D, an energy band diagram of $MoS_2$, which is the first two-dimensional semiconductor material, is shown on the left side of h-BN, which is the material of the first insulating layer 140 and an energy band diagram of $MoS_2$, which is the second two-dimensional semiconductor material, is shown on the right side of h-BN. In the figure, $V_g$ denotes a particular (or, alternatively, predetermined) gate voltage applied to the substrate 110, and $V_d$ denotes a voltage applied between the first and second two-dimensional semiconductor layers 131 and 132 (e.g., between the first electrode 171 and the second electrode 172). $V_R$ represents a resonant voltage at which resonant tunneling occurs.

Figure 3A:
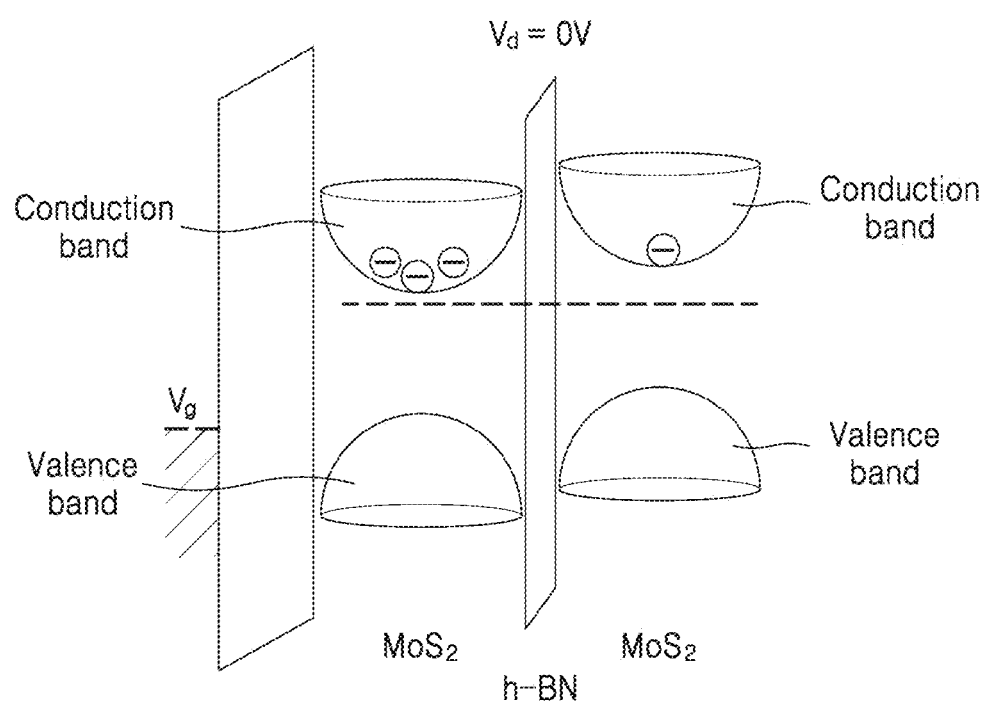
FIGS. 3A, 3B, 3C, and 3D illustrate resonant tunneling and an NDR effect according to voltage applied between first and second electrodes in the resonant tunneling device according to some example embodiments.
Figure 3B:
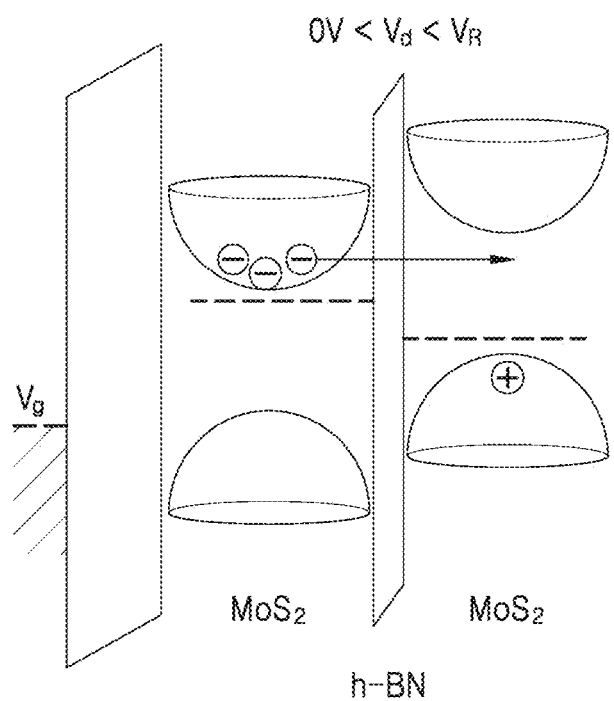

Referring to FIG. 3A, when the voltage applied between the first electrode 171 and the second electrode 172 is 0 V, no current flows through the resonant tunneling device 100. Referring to FIG. 3B, when the voltage is applied between the first electrode 171 and the second electrode 172, a charge density of $MoS_2$, which is the first and second two-dimensional semiconductor materials, and $MoS_2$, which is the second two-dimensional semiconductor material, may change, and a relative Fermi level difference may be formed. Next, when the voltage applied between the first electrode 171 and the second electrode 172 increases gradually, current flowing through the resonant tunneling device 100 increases due to the tunneling effect.

Figure 3C:
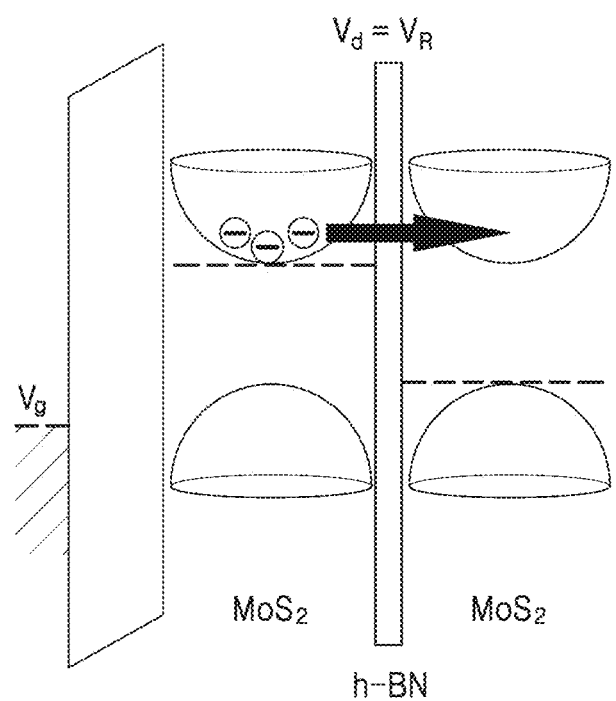

Referring to FIG. 3C, when the voltage applied between the first electrode 171 and the second electrode 172 increases to the resonant voltage $V_R$, an energy band of $MoS_2$, which is the first two-dimensional semiconductor material, and an energy band of $MoS_2$, which is the second two-dimensional semiconductor material, are aligned with each other, which greatly increases the tunneling current, and thus, resonant tunneling may occur. This is because the quantum mechanical effect maximizes the tunneling effect when energy states of the first and second two-dimensional semiconductor materials are aligned with each other.

Figure 3D:
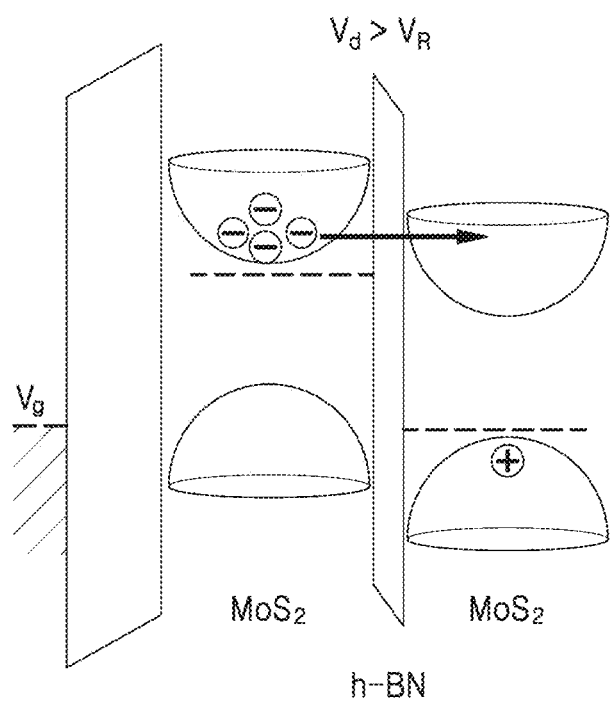

Referring to FIG. 3D, when the voltage applied between the first electrode 171 and the second electrode 172 is greater than the resonant voltage $V_R$, an NDR effect in which the current flowing through the resonant tunneling device 100 is rather reduced occurs.

In some example embodiments, because a crystal lattice of $MoS_2$, which is the first two-dimensional semiconductor material, and a crystal lattice of $MoS_2$, which is the second two-dimensional semiconductor material are aligned with each other, the resonant tunneling and the NDR effect may more clearly appear than when crystal lattices are not aligned.

Most of two-dimensional semiconductor materials have various energy distributions in k-space, and thus it is difficult to induce accurate alignment of an energy band unless precise alignment is made between crystal lattices. However, in some example embodiments, because the crystal lattice of $MoS_2$, which is the first two-dimensional semiconductor material, and the crystal lattice of $MoS_2$, which is the second two-dimensional semiconductor material, are aligned with each other, resonant tunneling and the NDR effect may more efficiently appear by inducing the accurate alignment of the energy band.

Because resonant tunneling and the NDR effect generated by the quantum mechanical effect are closely related to an electronic structure of a material, the resonant tunneling device 100 according to some example embodiments may effectively detect material properties of a two-dimensional semiconductor material such as an electronic structure, a bandgap, or a quantum capacitance by using resonant tunneling and the NDR effect. Also, the resonant tunneling device 100 according to some example embodiments may effectively detect the temperature therearound or the wavelength or intensity of light applied thereto.

Figure 4:
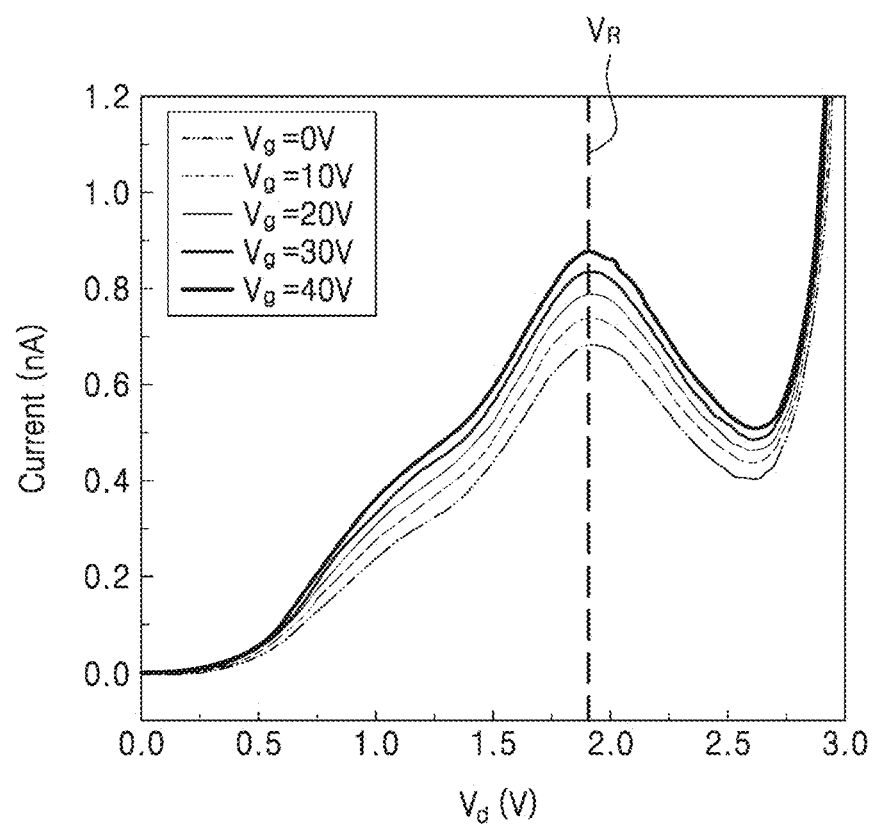
FIG. 4 shows a voltage-current property curve with respect to a gate voltage of a general resonant tunneling device.

FIG. 4 shows a voltage-current property curve with respect to a gate voltage of a general resonant tunneling device. Here, the general resonant tunneling device has the same structure as the resonant tunneling device 100 shown in FIG. 1, except that a crystal lattice of a first two-dimensional semiconductor material and a crystal lattice of a second two-dimensional semiconductor material are not aligned. $MoS_2$ is used as the first and second two-dimensional semiconductor materials, and h-BN is used as a first insulating layer material provided between first and second two-dimensional semiconductor layers. Silicon and silicon oxide are used as a substrate and a second insulating layer material, respectively.

Referring to FIG. 4, the resonant tunneling and NDR effect may appear in the general resonant tunneling device. However, unlike the resonant tunneling device according to some example embodiments that will be described later, it may be seen that, in the general resonant tunneling device, a resonant voltage at which resonant tunneling occurs is constant even though a gate voltage applied to the substrate changes.

FIGS. 5 through 9 are experimental results showing properties of the resonant tunneling device 100 according to some example embodiments shown in FIG. 1. In the resonant tunneling device 100 according to some example embodiments, $MoS_2$ is used as first and second two-dimensional semiconductor materials, and a crystal lattice of $MoS_2$, which is the first two-dimensional semiconductor material, and a crystal lattice of $MoS_2$, which is the second two-dimensional semiconductor material, are aligned with each other. In addition, h-BN is used as a material of the first insulating layer 140 provided between the first and second two-dimensional semiconductor layers 131 and 132. Silicon and silicon oxide are used as the substrate 110 and the second insulating layer 120 material, respectively.

Figure 5:
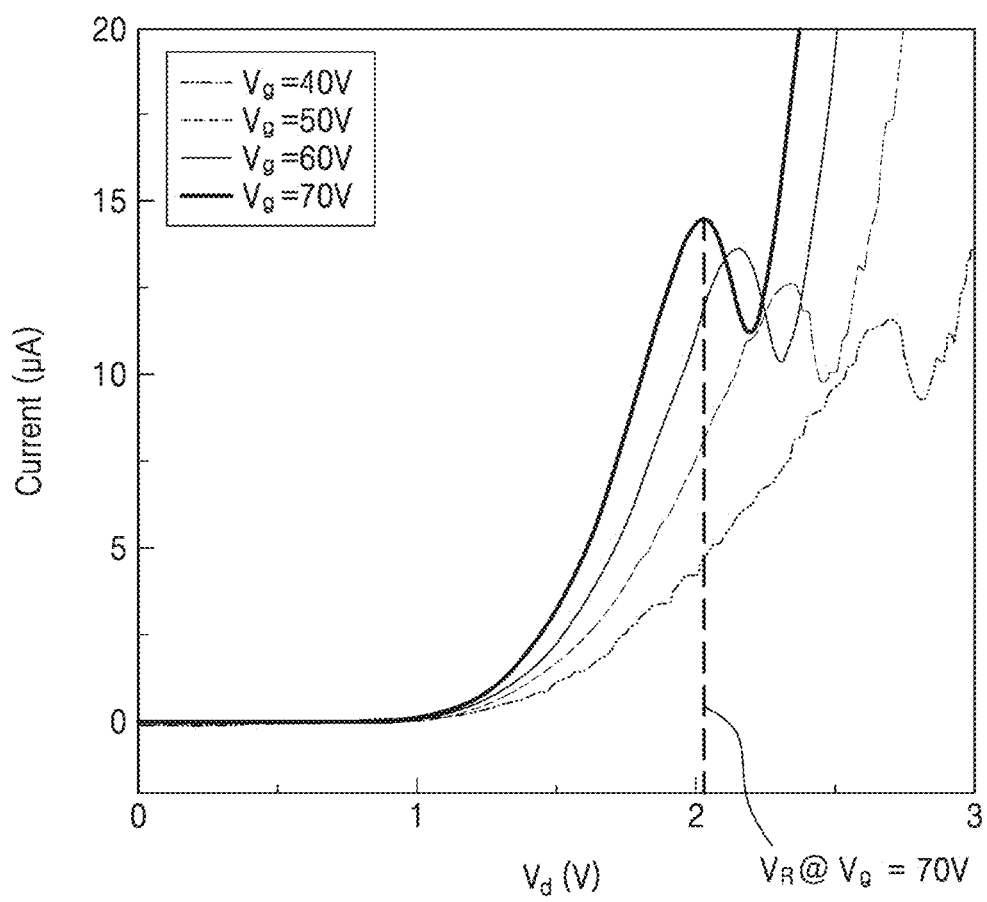
FIG. 5 shows a voltage-current property curve with respect to a gate voltage of a resonant tunneling device according to some example embodiments.

FIG. 5 shows a voltage-current property curve with respect to a gate voltage of the resonant tunneling device 100 according to some example embodiments.

Referring to FIG. 5, in the resonant tunneling device 100 according to some example embodiments, because the crystal lattice of the first two-dimensional semiconductor material and the crystal lattice of the second two-dimensional semiconductor material are aligned with each other, an accurate alignment of an energy band may be induced, and thus, it may be seen that resonant tunneling and an NDR effect clearly appear.

Also, in the resonant tunneling device 100 according to some example embodiments, it may be seen that a resonant voltage, which is voltage at which resonant tunneling occurs, changes according to a gate voltage. This is because that an amount of charges induced in the first and second two-dimensional semiconductor materials changes according to the gate voltage such that the resistance changes, and accordingly, by the voltage applied between the first and second electrodes, an effective voltage applied between the first and second two-dimensional semiconductor materials changes.

Accordingly, if the resistance of the first and second two-dimensional semiconductor materials are sufficiently reduced by sufficiently increasing the gate voltage, because most of the voltage applied between the first and second electrodes is applied to an h-BN insulating layer between the first two-dimensional semiconductor material and the second two-dimensional semiconductor material, the resonant voltage $V_R$ appearing at this time may be regarded as corresponding to a bandgap of $MoS_2$, which is the first and second two-dimensional semiconductor materials.

As described above, the resonant tunneling device 100 according to some example embodiments may detect, for example, physical properties such as an electronic structure of the two-dimensional semiconductor material, a bandgap, a quantum capacitance, etc. by using the NDR effect generated according to a change of the gate voltage. It will be understood that, in some example embodiments, any of the example embodiments of resonant tunneling devices as described herein may be configured to detect one or more physical properties of the first two-dimensional semiconductor material and the second two-dimensional semiconductor material based on a negative differential resistance (NDR) effect, for example, physical properties such as an electronic structure of the two-dimensional semiconductor material, a bandgap, a quantum capacitance, etc. by using the NDR effect generated according to a change of the gate voltage.

Figure 6:
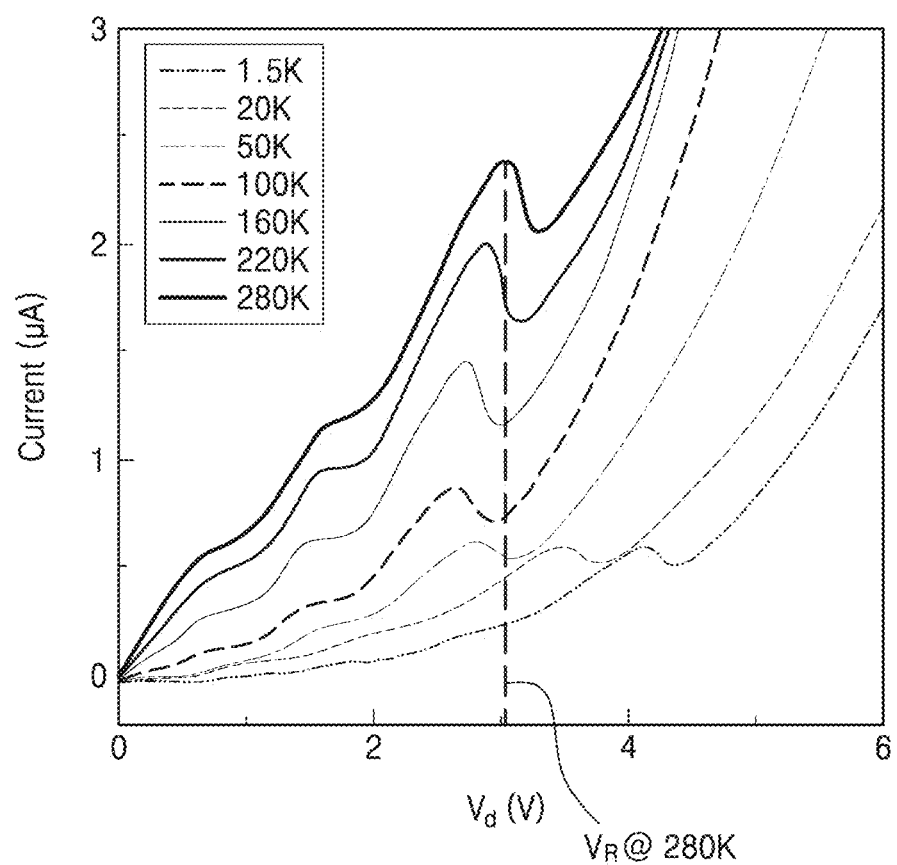
FIG. 6 shows a voltage-current property curve of a resonant tunneling device with respect to temperature according to some example embodiments.

FIG. 6 shows a voltage-current property curve of the resonant tunneling device 100 with respect to temperature according to some example embodiments.

Referring to FIG. 6, it may be seen that an NDR effect more clearly appears as an ambient temperature of the resonant tunneling device 100 increases. This is because the resistance of first and second two-dimensional semiconductor materials is reduced as the temperature increases. It may be seen that the NDR effect becomes clear toward the room temperature.

As described above, the resonant tunneling device 100 according to some example embodiments may detect an ambient temperature of the resonant tunneling device 100 by using the NDR effect generated according to a change in temperature. It will be understood that, in some example embodiments, any of the example embodiments of resonant tunneling devices as described herein may be configured to detect a temperature, for example an ambient temperature of the resonant tunneling devices, based on the NDR effect generated according to a change in temperature.

Figure 7:
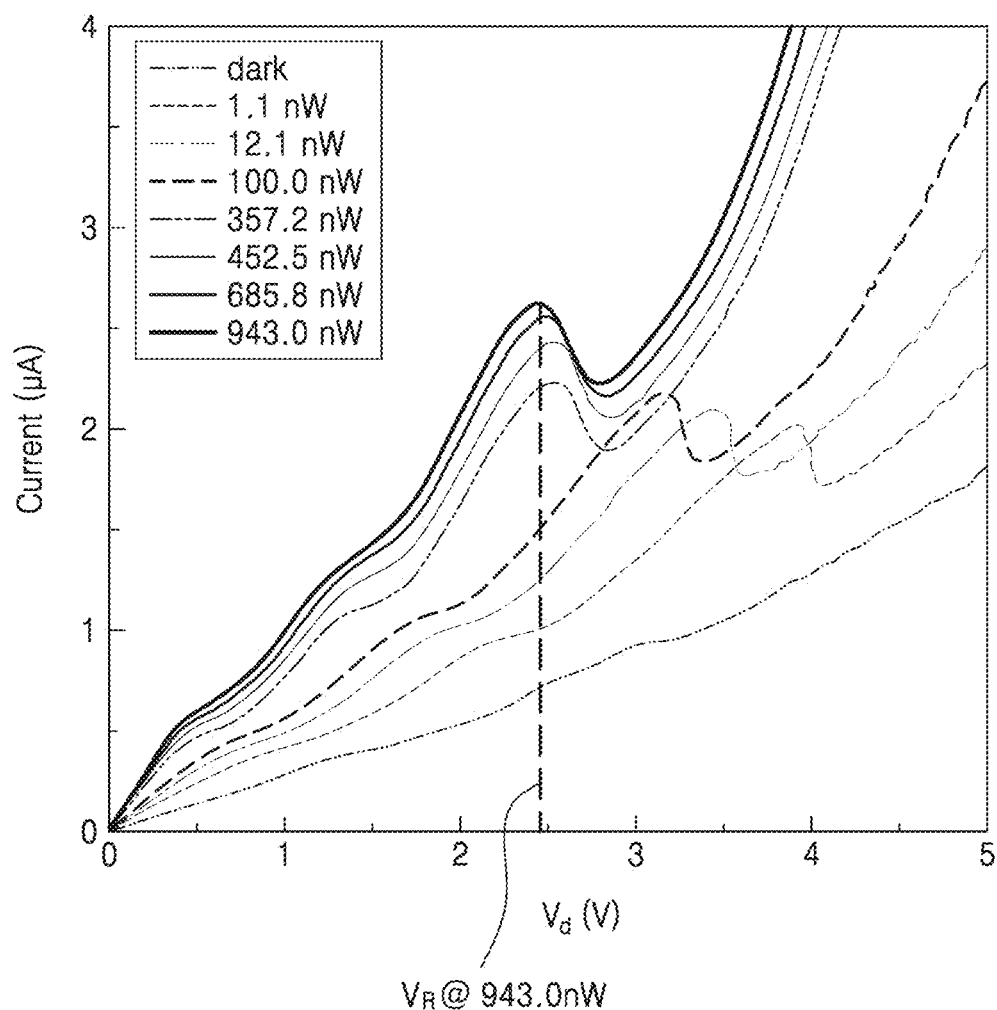
FIG. 7 shows a voltage-current property curve with respect to power of incident light of a resonant tunneling device according to some example embodiments.

FIG. 7 shows a voltage-current property curve with respect to power of incident light of the resonant tunneling device 100 according to some example embodiments. Here, laser light having a wavelength of 638 nm is used as the incident light.

Referring to FIG. 7, it may be seen that when light having energy greater than an optical bandgap of $MoS_2$, which is first and second two-dimensional semiconductor materials, is incident on the resonant tunneling device 100, an NDR effect that does not appear in a dark state appears. Therefore, it may be seen that the resonant tunneling device 100 according to some example embodiments may be implemented as an efficient photodetector capable of detecting the wavelength of the incident light. It will be understood that, in some example embodiments, any of the example embodiments of resonant tunneling devices as described herein may be configured to detect the wavelength of the incident light on the resonant tunneling devices based on the NDR effect. Also, as shown in FIG. 7, it may be seen that a resonant voltage at which resonant tunneling is generated varies very sensitively according to the intensity of light. Therefore, the resonant tunneling device 100 according to some example embodiments may be effectively used for detecting the intensity of the incident light. It will be understood that, in some example embodiments, any of the example embodiments of resonant tunneling devices as described herein may be configured to detect the intensity of the incident light on the resonant tunneling devices based on the NDR effect.

Figure 8:
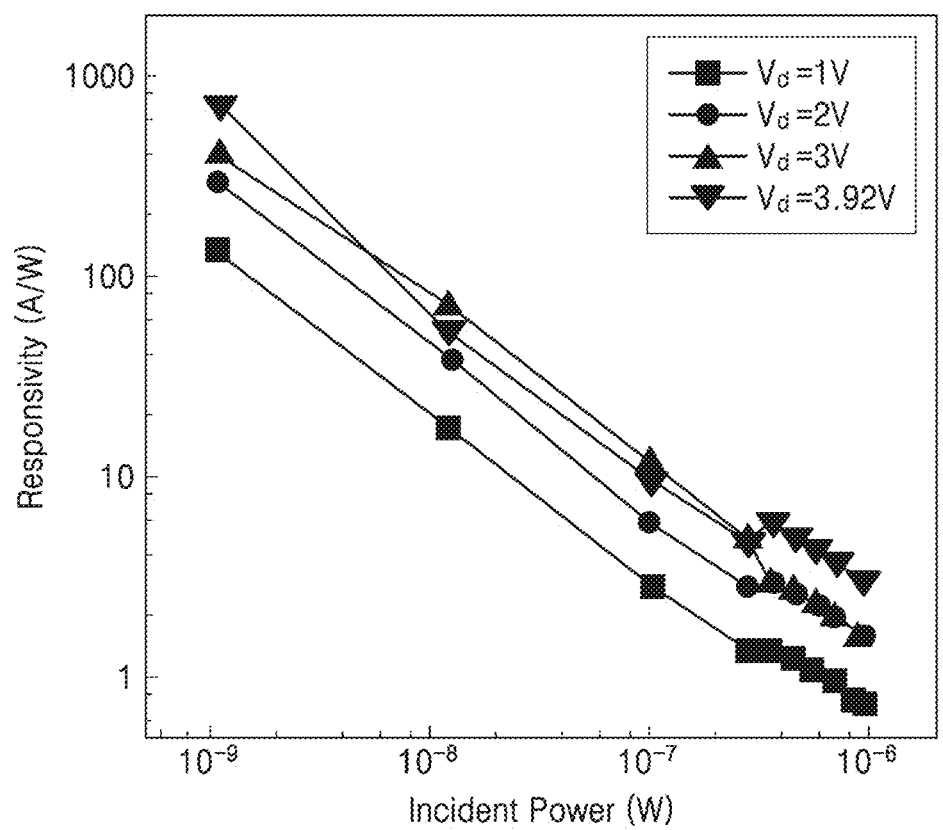
FIG. 8 shows a response property of a resonant tunneling device with respect to incident light according to some example embodiments.
Figure 9:
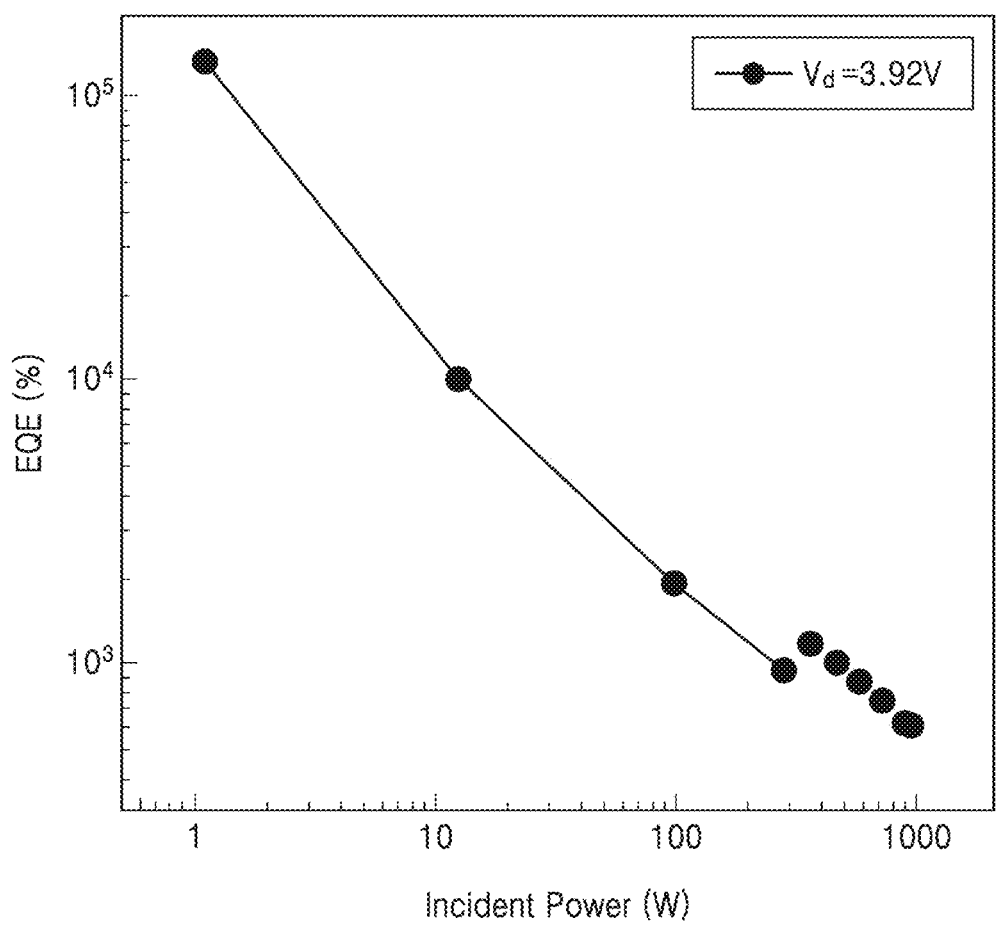
FIG. 9 shows an external quantum efficiency of a resonant tunneling device with respect to incident light according to some example embodiments.

FIG. 8 shows a response property of a resonant tunneling device with respect to incident light according to some example embodiments. FIG. 9 shows an external quantum efficiency of a resonant tunneling device with respect to incident light according to some example embodiments. Here, laser light having a wavelength of 638 nm is used as the incident light.

Referring to FIGS. 8 and 9, it may be seen that the resonant tunneling device according to some example embodiments has a good response property with respect to the incident light and has a good external quantum efficiency with respect to the incident light.

Figure 14:
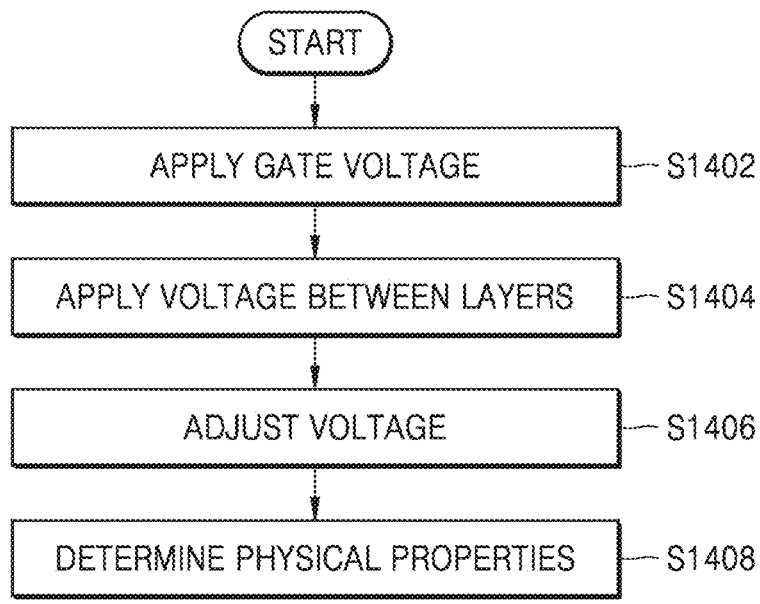
FIGS. 14 and 15 are flowcharts that illustrate methods of operating a resonant tunneling device according to some example embodiments.
Figure 15:
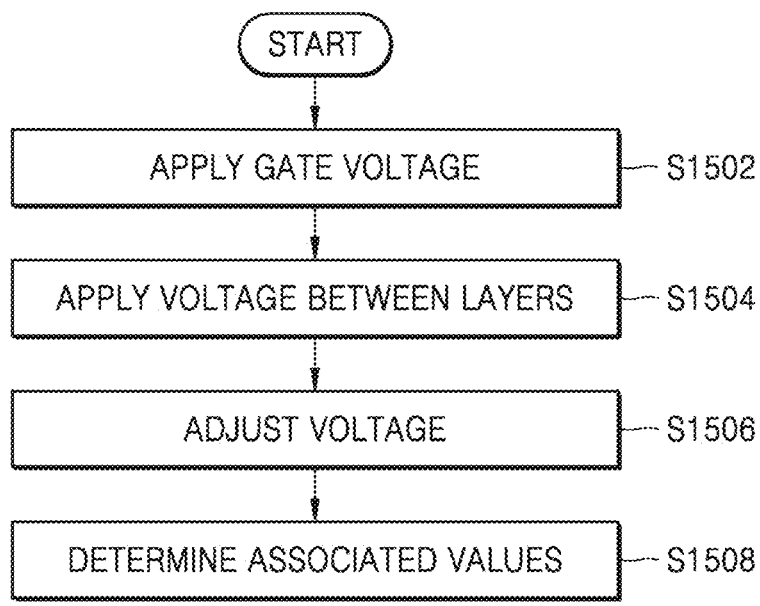
Figure 16:
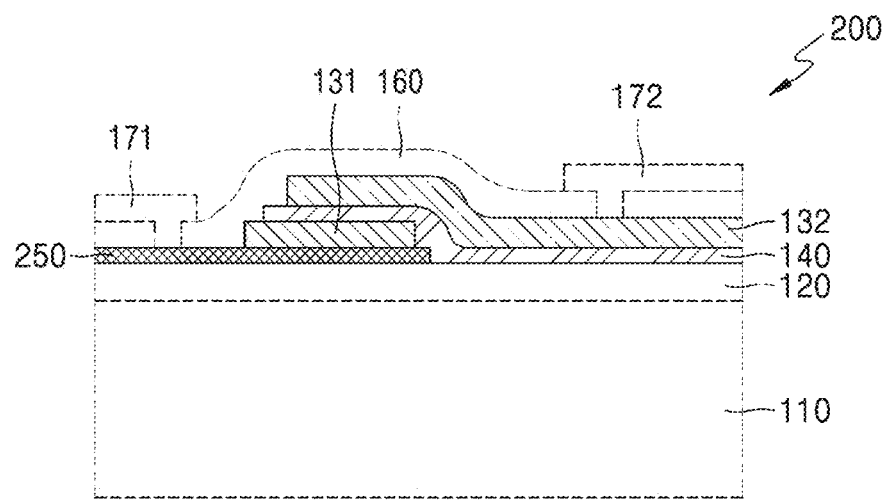
FIGS. 16, 17, 18, and 19 show resonant tunneling devices according to some example embodiments.
Figure 17:
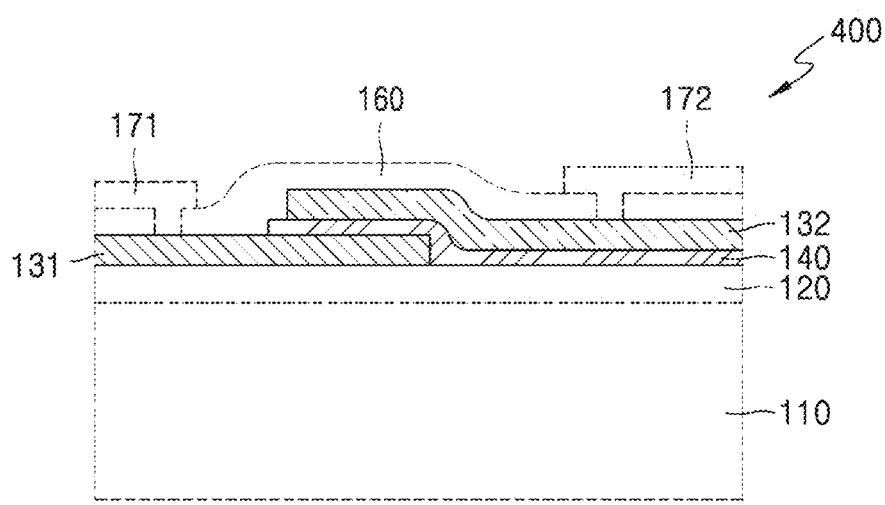
Figure 18:
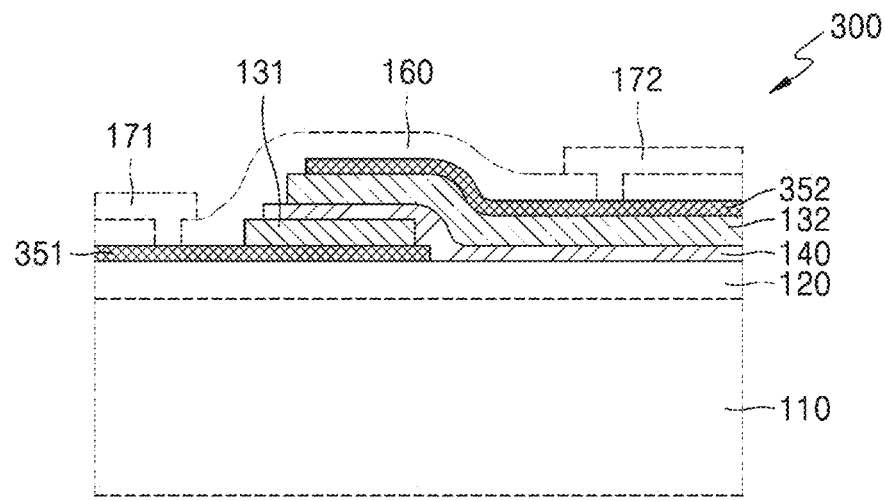
Figure 19:
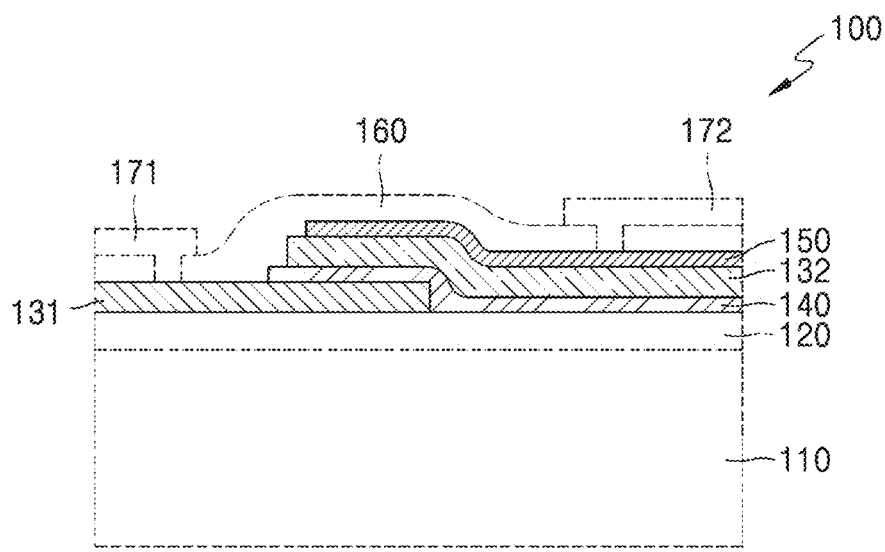

FIGS. 14 and 15 are flowcharts that illustrate methods of operating a resonant tunneling device according to some example embodiments. It will be understood that the operations described with reference to FIGS. 14 and 15 may be performed with regard to any of the example embodiments of resonant tunneling devices of any of the example embodiments.

Referring to FIG. 14, a method for detecting physical properties of the first two-dimensional semiconductor material of the first two-dimensional semiconductor layer 131 and the second two-dimensional semiconductor material of the second two-dimensional semiconductor layer 132 may include, at operation S1402, applying a particular gate voltage $V_g$ to a gate electrode of the resonant tunneling device. In some example embodiments, with reference to FIG. 1, the gate electrode may be the substrate 110, such that operation S1402 includes applying a gate voltage Vg to the substrate 110.

At operation S1404, separate voltages may be applied to the first and second two-dimensional semiconductor layers 131 and 132 via separate, respective electrodes that are electrically connected (e.g., directly electrically connected) to separate layers of the first and second two-dimensional semiconductor layers 131 and 132. Said electrodes may be the first electrode 171 and the second electrode 172, respectively. Said voltages applied via the separate electrodes 171, 172 may be different, such that a $V_d$ denotes a voltage applied between the first and second two-dimensional semiconductor layers 131 and 132.

At operation S1406, the respective voltages applied to one or both of the first and second two-dimensional semiconductor layers 131 and 132 may be adjusted to cause the voltage $V_d$ applied between the first and second two-dimensional semiconductor layers 131 and 132 to be adjusted (e.g., increased in magnitude). The gate voltage $V_g$ may be held at a fixed magnitude while voltage $V_d$ is adjusted. The adjusting at operation S1406 may further include causing voltage $V_d$ to be adjusted to at least meet the resonant voltage $V_R$ such that resonant tunneling occurs in the resonant tunneling device with respect to the first and second two-dimensional semiconductor layers 131 and 132. The adjusting at operation S1406 may further include causing voltage $V_d$ to be adjusted to exceed the resonant voltage $V_R$ such that an NDR effect in which the current flowing through the resonant tunneling device is rather reduced occurs.

At operation S1408, one or more physical properties of the first and second two-dimensional semiconductor materials (e.g., an electronic structure, a bandgap, or a quantum capacitance) may be determined based on processing the results of the adjusting at operation S1406. Such processing may include determining the resonant voltage $V_R$ achieved at operation S1406, for example based on identifying a local maximum tunneling current in the resonant tunneling device as a function of the voltage $V_d$, for example as shown in FIG. 4. Such processing may include comparing the determined resonant voltage $V_R$ with one or more entries of a database that associates resonant voltage values $V_R$ with corresponding physical property values (e.g., such as an electronic structure of the two-dimensional semiconductor material, a bandgap, a quantum capacitance, or the like). Such a database may be a Look-Up-Table ("LUT") that is stored in a computer readable storage medium and which is generated via well-known empirical methods.

Referring to FIG. 15, a method for detecting one or more of a temperature, a wavelength of light, or an intensity of the light with regard to a resonant tunneling device that includes the first two-dimensional semiconductor layer 131 and the second two-dimensional semiconductor material of the second two-dimensional semiconductor layer 132 may include, at operation S1502, applying a particular gate voltage $V_g$ to a gate electrode of the resonant tunneling device. In some example embodiments, with reference to FIG. 1, the gate electrode may be the substrate 110, such that operation S1502 includes applying a gate voltage $V_g$ to the substrate 110.

At operation S1504, separate voltages may be applied to the first and second two-dimensional semiconductor layers 131 and 132 via separate, respective electrodes that are electrically connected (e.g., directly electrically connected) to separate layers of the first and second two-dimensional semiconductor layers 131 and 132. Said electrodes may be the first electrode 171 and the second electrode 172, respectively. Said voltages applied via the separate electrodes 171, 172 may be different, such that a $V_d$ denotes a voltage applied between the first and second two-dimensional semiconductor layers 131 and 132.

At operation S1506, the respective voltages applied to one or both of the first and second two-dimensional semiconductor layers 131 and 132 may be adjusted to cause the voltage $V_d$ applied between the first and second two-dimensional semiconductor layers 131 and 132 to be adjusted (e.g., increased in magnitude). The gate voltage $V_g$ may be held at a fixed magnitude while voltage $V_d$ is adjusted. The adjusting at operation S1506 may further include causing voltage $V_d$ to be adjusted to at least meet the resonant voltage $V_R$ such that resonant tunneling occurs in the resonant tunneling device with respect to the first and second two-dimensional semiconductor layers 131 and 132. The adjusting at operation S1506 may further include causing voltage $V_d$ to be adjusted to exceed the resonant voltage $V_R$ such that an NDR effect in which the current flowing through the resonant tunneling device is rather reduced occurs.

At operation S1508, one or more of a temperature, a wavelength of incident light, or an intensity of the incident light with regard to a resonant tunneling device may be determined based on processing the results of the adjusting at operation S1506. Such processing may include determining the resonant voltage $V_R$ achieved at operation S1506, for example based on identifying a local maximum tunneling current in the resonant tunneling device as a function of the voltage $V_d$, for example as shown in FIG. 4. Such processing may include comparing the determined resonant voltage $V_R$ and/or a detected current through the resonant tunneling device with one or more entries of a database that associates resonant voltage values $V_R$ and/or detected current values ("magnitudes") with corresponding values of resonant tunneling device temperature, wavelength of incident light on the resonant tunneling device, and/or intensity of incident light on the resonant tunneling device, for example the associations as shown in FIGS. 6-9. Such a database may be a Look-Up-Table ("LUT") that is stored in a computer readable storage medium and which is generated via well-known empirical methods.

Figure 20:
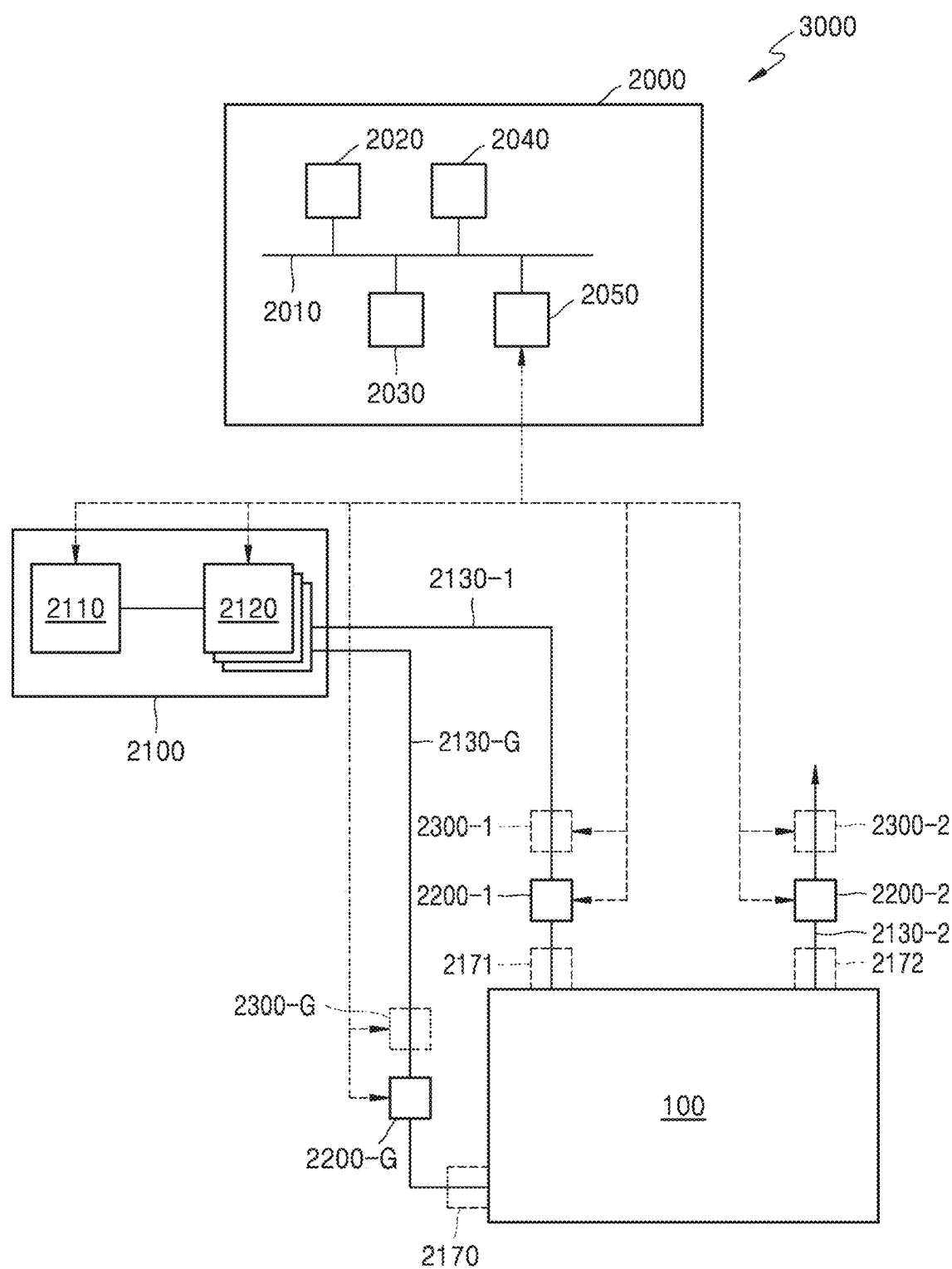
FIG. 20 shows a schematic of a system configured to control and monitor the application of voltage to various elements of a resonant tunneling device according to some example embodiments.

It will be understood that one or more of the operations of FIGS. 14 and 15, including but not limited to generating and/or storing the aforementioned LUTs, may be implemented by a computing device that includes a memory storing a program of instructions and a processor that executes the program of instructions to perform and/or control one or more aspects of one or more of the operations shown in FIGS. 14 and 15 (including controlling the application of voltage to one or more portions of the resonant tunneling device, detecting resonant tunneling current in the resonant tunneling device, or the like). Such a computing device, which may be computing device 2000 as shown in FIG. 20, may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement some or all of one or more operations of the method shown in FIGS. 14 and 15. The computing device may be electrically coupled to one or more electrodes, including for example the first and second electrodes 171 and 172 and the substrate 110, and the computing device may be configured to control a supply of electrical power to one or more of the electrodes to control the application and/or adjustment of voltage to one or more of the electrodes. The computing device may be coupled to one or more sensors that are electrically coupled to one or more elements of the resonant tunneling device, including for example a voltmeter and/or ammeter, such that the computing device may be configured to receive signals from the one or more sensors and process said signals to determine a voltage applied to one or more electrodes associated with the resonant tunneling device, a current flowing through at least a portion of the resonant tunneling device, any combination thereof, or the like.

Figure 10:
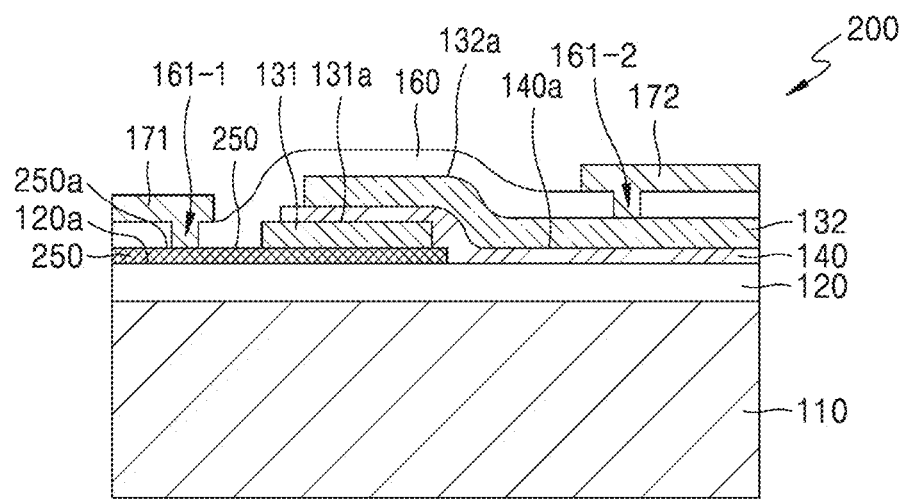
FIG. 10 shows a resonant tunneling device according to some example embodiments.

FIG. 10 shows a resonant tunneling device 200 according to some example embodiments.

Referring to FIG. 10, the resonant tunneling device 200 may include a substrate 110, a graphene layer 250, a first two-dimensional semiconductor layer 131, a first insulating layer 140 and a second two-dimensional semiconductor layer 132 that are sequentially stacked on the substrate 110.

The substrate 110 may include a conductive material. Here, the substrate 110 may serve as a gate electrode. The substrate 110 may include, for example, a semiconductor material or metal. The second insulating layer 120 may be formed on an upper surface of the substrate 110. The second insulating layer 120 may serve as a gate insulating layer.

The graphene layer 250 including graphene may be provided on an upper surface 120a of the second insulating layer 120. The graphene layer 250 may facilitate the flow of electrons and holes by easily adjusting the chemical potential of the first electrode 171, which will be described later.

The first two-dimensional semiconductor layer 131 including a first two-dimensional semiconductor material may be provided on an upper surface 250a of the graphene layer 250. Here, the first two-dimensional semiconductor material may include, for example, TMD.

The first insulating layer 140 may be formed on an upper surface 131a of the first two-dimensional semiconductor layer 131. The first insulating layer 140 may include a two-dimensional insulating material such as h-BN or the like or oxide. The second two-dimensional semiconductor layer 132 including a second two-dimensional semiconductor material may be formed on an upper surface 140a of the first insulating layer 140. Here, the second two-dimensional semiconductor material may be the same kind of material as the first two-dimensional semiconductor material described above. For example, the second two-dimensional semiconductor material may include TMD. Here, the second two-dimensional semiconductor material may be disposed such that its crystal lattice is in alignment with a crystal lattice of the first two-dimensional semiconductor material provided therebelow.

The first two-dimensional semiconductor layer 131 may be electrically connected to a first electrode 171 through the graphene layer 250, and the second two-dimensional semiconductor layer 132 may be electrically connected to the second electrode 172. The first electrode 171 may be provided to be connected to the graphene layer 250 through a via hole 161-1 formed in the third insulating layer 160, and the second electrode 172 may be provided to be connected to the second two-dimensional semiconductor layer 132 through another via hole 161-2 formed in the third insulating layer 160.

The first and second electrodes 171 and 172 may be source and drain electrodes, respectively. The first and second electrodes 171 and 172 may include, for example, metal having excellent conductivity.

Figure 11:
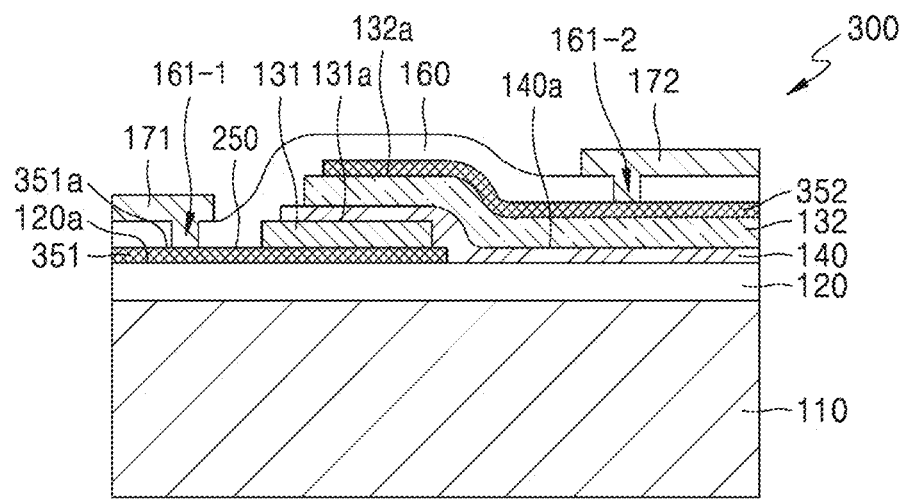
FIG. 11 shows a resonant tunneling device according to some example embodiments.

FIG. 11 shows a resonant tunneling device 300 according to some example embodiments.

Referring to FIG. 11, the resonant tunneling device 300 may include a substrate 110, a first graphene layer 351, a first two-dimensional semiconductor layer 131, a first insulating layer 140, a second two-dimensional semiconductor layer 132, and a second graphene layer 352 that are sequentially stacked on the substrate 110.

The substrate 110 may include a conductive material. Here, the substrate 110 may serve as a gate electrode. A second insulating layer 120 may be formed on an upper surface of the substrate 110. The second insulating layer 120 may serve as a gate insulating layer.

The first graphene layer 351 including graphene may be provided on an upper surface 120a of the second insulating layer 120. The first two-dimensional semiconductor layer 131 including a first two-dimensional semiconductor material may be provided on an upper surface 351a of the first graphene layer 351. Here, the first two-dimensional semiconductor material may include, for example, TMD.

The first insulating layer 140 may be formed on the upper surface 131a of the first two-dimensional semiconductor layer 131. The first insulating layer 140 may include a two-dimensional insulating material such as h-BN or the like or oxide. The second two-dimensional semiconductor layer 132 including a second two-dimensional semiconductor material may be formed on an upper surface 140a of the first insulating layer 140. Here, the second two-dimensional semiconductor material may be the same kind of material as the first two-dimensional semiconductor material described above. For example, the second two-dimensional semiconductor material may include TMD. Here, the second two-dimensional semiconductor material may be disposed such that its crystal lattice is in alignment with a crystal lattice of the first two-dimensional semiconductor material provided therebelow.

The second graphene layer 352 including graphene may be provided on an upper surface 132a of the second two-dimensional semiconductor layer 132. The first two-dimensional semiconductor layer 131 may be electrically connected to a first electrode 171 through the first graphene layer 351, and the second two-dimensional semiconductor layer 132 may be electrically connected to the second electrode 172 through the second graphene layer 352.

The first electrode 171 may be provided to be connected to the first graphene layer 351 through a via hole 161-1 formed in a third insulating layer 160, and the second electrode 172 may be provided to be connected to the second graphene layer 352 through another via hole 161-2 formed in the third insulating layer 160. The first and second electrodes 171 and 172 may be source and drain electrodes, respectively.

Figure 12:
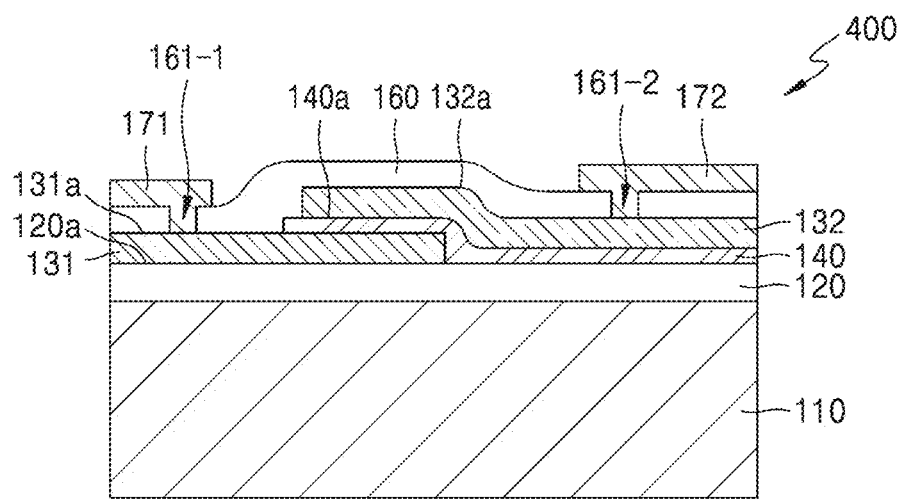
FIG. 12 shows a resonant tunneling device according to some example embodiments.

FIG. 12 shows a resonant tunneling device 400 according to some example embodiments.

Referring to FIG. 12, the resonant tunneling device 400 may include a substrate 110, a first two-dimensional semiconductor layer 131, a first insulating layer 140, and a second two-dimensional semiconductor layer 132 that are sequentially stacked on the substrate 110.

The substrate 110 may include a conductive material. Here, the substrate 110 may serve as a gate electrode. A second insulating layer 120 may be formed on an upper surface 110a of the substrate 110. The second insulating layer 120 may serve as a gate insulating layer.

The first two-dimensional semiconductor layer 131 including a first two-dimensional semiconductor material may be provided on an upper surface 120a of the second insulating layer 120. Here, the first two-dimensional semiconductor material may include, for example, TMD. The first insulating layer 140 may be formed on an upper surface 131a of the first two-dimensional semiconductor layer 131. The first insulating layer 140 may include a two-dimensional insulating material such as h-BN or the like or oxide.

The second two-dimensional semiconductor layer 132 including a second two-dimensional semiconductor material may be formed on an upper surface 140a of the first insulating layer 140. Here, the second two-dimensional semiconductor material may be the same kind of material as the first two-dimensional semiconductor material described above. For example, the second two-dimensional semiconductor material may include TMD. Here, the second two-dimensional semiconductor material may be disposed such that its crystal lattice is in alignment with a crystal lattice of the first two-dimensional semiconductor material provided therebelow.

The first two-dimensional semiconductor layer 131 may be electrically connected to a first electrode 171, and the second two-dimensional semiconductor layer 132 may be electrically connected to the second electrode 172. The first electrode 171 may be provided to be connected to the first two-dimensional semiconductor layer 131 through a via hole 161-1 formed in the third insulating layer 160, and the second electrode 172 may be provided to be connected to the second two-dimensional semiconductor layer 132 through another via hole 161-2 formed in the third insulating layer 160. The first and second electrodes 171 and 172 may be source and drain electrodes, respectively.

Figure 13:
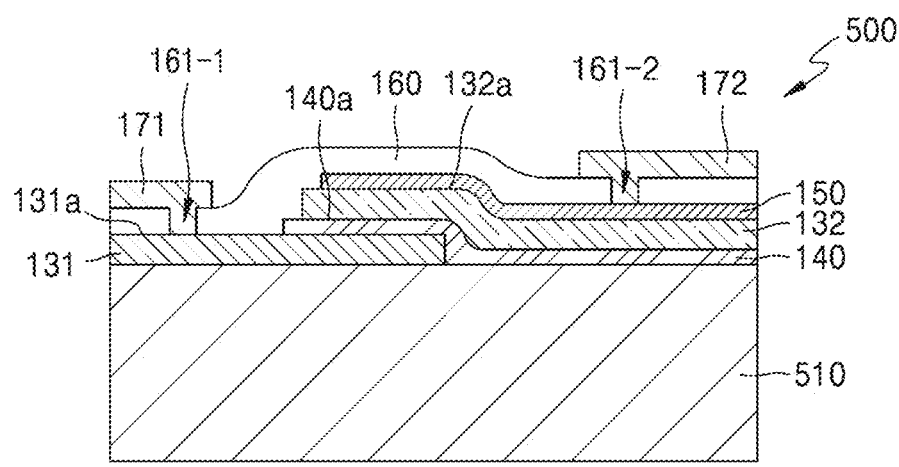
FIG. 13 shows a resonant tunneling device according to some example embodiments.

FIG. 13 shows a resonant tunneling device 500 according to some example embodiments.

Referring to FIG. 13, the resonant tunneling device 500 may include a substrate 510, a first two-dimensional semiconductor layer 131, a first insulating layer 140, a second two-dimensional semiconductor layer 132, and a graphene layer 352 that are sequentially stacked on the substrate 510.

The substrate 510 may include an insulating material. The first two-dimensional semiconductor layer 131 including a first two-dimensional semiconductor material may be provided on an upper surface of the substrate 510. Here, the first two-dimensional semiconductor material may include, for example, TMD. The first insulating layer 140 may be formed on an upper surface 131a of the first two-dimensional semiconductor layer 131. The first insulating layer 140 may include a two-dimensional insulating material such as h-BN or the like or oxide.

The second two-dimensional semiconductor layer 132 including a second two-dimensional semiconductor material may be formed on an upper surface 140a of the first insulating layer 140. Here, the second two-dimensional semiconductor material may be the same kind of material as the first two-dimensional semiconductor material described above. For example, the second two-dimensional semiconductor material may include TMD. Here, the second two-dimensional semiconductor material may be disposed such that its crystal lattice is in alignment with a crystal lattice of the first two-dimensional semiconductor material provided therebelow.

The graphene layer 150 including graphene may be provided on an upper surface 132*a* of the second two-dimensional semiconductor layer 132. The first two-dimensional semiconductor layer 131 may be electrically connected to a first electrode 171, and the second two-dimensional semiconductor layer 132 may be electrically connected to the second electrode 172 through the graphene layer 150. The first electrode 171 may be provided to be connected to the first two-dimensional semiconductor layer 131 through a via hole 161-1 formed in a third insulating layer 160, and the second electrode 172 may be provided to be connected to the graphene layer 150 through another via hole 161-2 formed in the third insulating layer 160. The first and second electrodes 171 and 172 may include, for example, metal having excellent conductivity.

Meanwhile, FIG. 13 illustrates an example in which the graphene layer 150 is provided on the second two-dimensional semiconductor layer 132. However, the graphene layer 150 is not limited thereto, and the graphene layer 150 may be provided on the first two-dimensional semiconductor layer 131 or each of the first and second two-dimensional semiconductor layers 131 and 132. Restated, with reference to FIGS. 1, 10, and 11, a graphene layer may be on (e.g., directly on) at least one of the first two-dimensional semiconductor layer 132 or a second two-dimensional semiconductor layer 131. Also, the graphene layer 150 may be omitted.

According to the resonant tunneling device according to some example embodiments described above, crystal lattices of stacked two-dimensional semiconductor materials may be aligned with each other such that an accurate alignment of an energy band may be induced, and thus, resonant tunneling and an NDR effect clearly appear.

FIGS. 16, 17, 18, and 19 show resonant tunneling devices according to some example embodiments.

Referring to FIGS. 16, 17, 18, and 19, in some example embodiments, one or more elements of the resonant tunneling devices 100, 200, 300, and 400 as described herein may omit one or more elements, including one or more of the substrate 110, the second insulating layer 120, the third insulating layer 160, the first electrode 171, the second electrode 172, a graphene layer 150, a graphene layer 250, a first graphene layer 351, a second graphene layer 352, any combination thereof, or the like.

FIG. 20 shows a schematic of a system 3000 configured to control and monitor the application of voltage to various elements of a resonant tunneling device according to some example embodiments. As used herein, a system 3000 may be referred to as a "set."

Referring to FIG. 20, system 3000 includes a computing device 2000 (also referred to herein interchangeably as an electronic device), a power supply 2100, and a resonant tunneling device 100. It will be understood that the resonant tunneling device of system 3000 may be any of the example embodiments of resonant tunneling devices according to any of the example embodiments, in place of the resonant tunneling device 100 shown in FIG. 20.

Referring first to the computing device 2000, the computing device 2000 may include processing circuitry 2020 (also referred to herein as simply a processor), memory 2030, power supply 2040, and communication interface 2050 that are communicatively and/or electrically coupled together via a bus 2010.

The computing device 2000 may be included in one or more various electronic devices, including, for example, a mobile phone, a digital camera, a sensor device, or the like. In some example embodiments, the computing device 2000 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like.

The system 3000 may include one or more various electronic devices. Such electronic devices may include, for example, a mobile phone, a digital camera, a sensor device, a server, a mobile device, a personal computer (PC), a tablet computer, a laptop computer, a netbook, a vehicle, an autonomous vehicle, some combination thereof, or the like The memory 2030, the processing circuitry 2020, the power supply 2040, and the communication interface 2050 may communicate with one another through the bus 2010.

The communication interface 2050 may communicate data to and/or from an external device using various communication protocols. In some example embodiments, the communication interface may be connected to an electronic line (e.g., wire) and may be configured to receive and process electrical signals from one or more external devices.

The processing circuitry 2020 may execute a program and control one or more aspects of the system 3000, via the communication interface 2050 as shown in FIG. 20. A program code to be executed by the processing circuitry 2020 may be stored in the memory 2030.

The memory 2030 may store information. The memory 2030 may be a volatile or a nonvolatile memory. The memory 2030 may be a non-transitory computer readable storage medium. The memory may store computer-readable instructions that, when executed, cause the execution of one or more methods, functions, processes, etc. as described herein. In some example embodiments, the processing circuitry 2020 may execute one or more of the computer-readable instructions stored at the memory 2030.

In some example embodiments, the communication interface 2050 may include a USB and/or HDMI interface. In some example embodiments, the communication interface 2050 may include a wireless communication interface.

Still referring to FIG. 20, power supply 2100 includes a power source 2110 and one or more power distribution devices 2120 that are configured to distribute portions of electrical power from the power source 2110 to separate electrodes coupled to separate portions of the resonant tunneling device 100. In some example embodiments, the power source 2110 may be any well-known type of power source, including a connection to an external power source (e.g., mains power). In some example embodiments, the power supply 2100 may be the power supply 2040 of the computing device 2000, for example in example embodiments where the power supply 2100 is included in the computing device 2000. In some example embodiments, each separate power distribution device 2120 may be any well-known device configured to adjust a voltage of power applied to a particular electrode.

As shown in FIG. 20, system 3000 includes separate lines 2130-G, 2130-1, 2130-2 that may couple the power distribution devices 2120 to separate electrodes that are connected to separate elements of the resonant tunneling device 100.

Line 2130-G connects one or more power distribution devices 2120 to a gate electrode associated with the resonant tunneling device 100 and thus enables a gate voltage $V_g$ to be applied to the gate electrode. In some example embodiments, the resonant tunneling device 100 may include a substrate 110 that serves as a gate electrode, such that line 2130-G connects one or more power distribution devices 2120 to the substrate 110 and thus enables a gate voltage $V_g$ to be applied to the substrate 110. In some example embodiments, the resonant tunneling device 100 omits a gate electrode, and thus system 3000 may include a gate electrode 2170 to which line 2130-G is connected from the one or more power distribution devices 2120 to enable the gate voltage $V_g$ to be applied to the gate electrode 2170.

Line 2130-1 connects one or more power distribution devices 2120 to a first electrode associated with the resonant tunneling device 100 and thus enables a first voltage $V_1$ to be applied to the first electrode. As further shown, line 2130-2 connects a second electrode associated with the resonant tunneling device 100 to an electrical ground. The first electrode may be connected to the first two-dimensional semiconductor layer 131 of the resonant tunneling device 100, and the second electrode may be connected to the second two-dimensional semiconductor layer 132 of the resonant tunneling device 100, and thus $V_d$, described herein to denote a voltage applied between the first and second two-dimensional semiconductor layers 131 and 132 (e.g., between the first electrode 171 and the second electrode 172, may denote a difference between the first voltage $V_1$ applied at a first electrode by line 2130-1 and a second voltage $V_2$, at a second electrode connected to line 2130-2, where the second voltage $V_2$ may be 0V.

In some example embodiments, the resonant tunneling device 100 may include a first electrode 171, such that line 2130-1 connects one or more power distribution devices 2120 to the first electrode 171 and thus enables a first voltage $V_1$ to be applied to the first electrode 171. In some example embodiments, the resonant tunneling device 100 omits a first electrode 171, and thus system 3000 may include a first electrode 2171 to which line 2130-1 is connected from the one or more power distribution devices 2120 to enable the first voltage $V_1$ to be applied to the first two-dimensional semiconductor layer 131 of the resonant tunneling device 100.

In some example embodiments, the resonant tunneling device 100 may include a second electrode 172, such that line 2130-2 connects the electrical ground to the first electrode 171 and thus enables a second voltage $V_2$ to be applied to the second electrode 172. In some example embodiments, the resonant tunneling device 100 omits a second electrode 172, and thus system 3000 may include a second electrode 2172 to which line 2130-2 is connected from the electrical ground to enable the second voltage $V_2$ to be applied to the second two-dimensional semiconductor layer 131 of the resonant tunneling device 100.

Still referring to FIG. 20, one or more voltage sensors 2200-G, 2200-1, 2200-2 may be electrically coupled to separate, respective lines of lines 2130-G, 2130-1, 2130-2 so as to detect the respective voltages applied to the separate, respective gate electrode, first electrode, and/or second electrode. As shown, the computing device 2000 may be communicatively coupled to one or more, or all, of the voltage sensors 2200-G, 2200-1, 2200-2 and thus may be configured to determine the gate voltage $V_g$ and voltage $V_d$ applied to the resonant tunneling device 100 based on processing data and/or signals generated by one or more of the voltage sensors 2200-G, 2200-1, 2200-2. The voltage sensors may be any well-known type of voltage sensor. It will be understood that one or more, or all, of the voltage sensors 2200-G, 2200-1, 2200-2 may be omitted from system 3000 in some example embodiments.

Still referring to FIG. 20, one or more current sensors 2300-G, 2300-1, 2300-2 may be electrically coupled to separate, respective lines of lines 2130-G, 2130-1, 2130-2 so as to detect the respective currents flowing to or from applied to the separate, respective gate electrode, first electrode, and/or second electrode. As shown, the computing device 2000 may be communicatively coupled to one or more, or all, of the current sensors 2300-G, 2300-1, 2300-2. The computing device 2000 may be configured to determine at least the current flowing between the first and second two-dimensional semiconductor layers 131 and 132 based on processing data and/or signals generated by one or more of the current sensors 2300-1, 2300-2. The current sensors may be any well-known type of current sensor. It will be understood that one or more, or all, of the current sensors 2300-G, 2300-1, 2300-2 may be omitted from system 3000 in some example embodiments.

It will be understood that some or all of the elements of the power supply 2100, lines 2130, voltage sensors 2200, current sensors 2300, and electrodes 2170, 2171, 2172 may be included in the computing device 2000, and the computing device may further include a connector that is configured to physically connect (reversibly or irreversibly) with a resonant tunneling device 100 to establish the electrical connections of system 3000 that are shown in FIG. 20.

The computing device 2000 may be configured to perform one or more controlling operations to control the application of voltage to one or more electrodes of the system, for example based on controlling one or more of the power source 2110 and one or more power distribution devices 2120, to adjustably control the application of the gate voltage $V_g$ and/or the voltage $V_d$ between the first and second two-dimensional semiconductor layers 131 and 132 of the resonant tunneling device 100. The computing device 2000 may determine values (e.g., magnitudes) of any of the gate voltage $V_g$ and/or the voltage $V_d$ based on processing sensor data and/or signals transmitted by one or more voltage sensors 2200-G, 2200-1, 2200-2.

The computing device 2000 may perform one or more determination operations to determine values (e.g., magnitudes) of the current flowing through any of the lines 2130 and/or the current flowing through the resonant tunneling device 100, including the current flowing between the first and second two-dimensional semiconductor layers 131 and 132 of the resonant tunneling device 100, based on processing sensor data and/or signals transmitted by one or more current sensors 2300-G, 2300-1, 2300-2.

The computing device 2000 may be configured to implement any of the methods described herein, including any of the methods shown in FIGS. 14-15 and/or described herein with reference to any of FIGS. 14-15, based on performing any of the aforementioned controlling and determination operations. Any operations performed by the computing device 2000 may be performed based on the processing circuitry 2020 executing a program of instructions stored in the memory 2030.

It will be understood that the performing any of the methods described herein regarding detections by the computing device 2000 may be referred to as at least the processing circuitry 2020 causing the resonant tunneling device 100 to perform the detections. For example, the computing device 2000 performing any of the methods described herein, based on performing any of the aforementioned controlling and determination operations, may be referred to as the processing circuitry 2020 controlling an application of voltage to at least one of the first two-dimensional semiconductor layer 131 or the second two-dimensional semiconductor layer 132 of the resonant tunneling device 100 to cause the resonant tunneling device 100 to perform at least one of detecting one or more physical properties of the first and second two-dimensional semiconductor materials, based on a negative differential resistance (NDR) effect, or detecting one or more of a temperature, a wavelength of light incident on the resonant tunneling device, or an intensity of the light incident on the resonant tunneling device, based on a negative differential resistance (NDR) effect.

Because resonant tunneling and the NDR effect generated by the quantum mechanical effect are closely related to an electronic structure of a material, the resonant tunneling device according to some example embodiments may effectively detect material properties of a two-dimensional semiconductor material such as an electronic structure, a bandgap, or a quantum capacitance by using resonant tunneling and the NDR effect. Also, the resonant tunneling device according to some example embodiments may effectively detect the temperature therearound or the wavelength or intensity of light applied thereto. Although some example embodiments have been described above, the present disclosure is not limited thereto, and various modifications may be made therefrom by those skilled in the art.

It should be understood that embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A resonant tunneling device, comprising:
    a first two-dimensional semiconductor layer including a first two-dimensional semiconductor material;
    a first insulating layer on the first two-dimensional semiconductor layer; and
    a second two-dimensional semiconductor layer on the first insulating layer, the second two-dimensional semiconductor layer including a second two-dimensional semiconductor material of a same kind as the first two-dimensional semiconductor material,
    wherein a crystal lattice of the first two-dimensional semiconductor material and a crystal lattice of the second two-dimensional semiconductor material are aligned with each other, such that the first two-dimensional semiconductor material and the second two-dimensional semiconductor material are configured to have respective energy bands that are aligned with each other.

2. The resonant tunneling device of claim 1, wherein the first two-dimensional semiconductor material and the second two-dimensional semiconductor material each include a same transition metal dichalcogenide (TMD).

3. The resonant tunneling device of claim 2, wherein the same TMD is expressed by <Equation 1>, $$M_{1-a}M_a'X_{2(1-b)}X_{2b}' \qquad \text{<Equation 1>}$$

wherein, in <Equation 1>, M and M' are different transition metal elements, X and X' are different chalcogen elements, 0≤a<1, and 0≤b<1.

4. The resonant tunneling device of claim 3, wherein, in <Equation 1>,
    M and M' are different from each other, and M and M' each include at least one of Ti, Zr, Hf, V, Nb, Ta, Mo, W, Tc, Re, Co, Rh, Ir, Ni, Pd, Pt, Zn, or Sn, and
    X and X' are different from each other, and X and X' each include at least one of S, Se or Te.

5. The resonant tunneling device of claim 1, wherein the first insulating layer includes a two-dimensional insulating material or an oxide material.

6. The resonant tunneling device of claim 1, further comprising:
    a first electrode electrically connected to the first two-dimensional semiconductor layer; and
    a second electrode electrically connected to the second two-dimensional semiconductor layer.

7. The resonant tunneling device of claim 1, further comprising:
    a substrate, wherein the first two-dimensional semiconductor layer is on the substrate.

8. The resonant tunneling device of claim 7, wherein the substrate includes an insulating material.

9. The resonant tunneling device of claim 1, further comprising:
    a second insulating layer, wherein the first two-dimensional semiconductor layer is on the second insulating layer; and
    a substrate, wherein the second insulating layer is on the substrate and includes an electrically conductive material.

10. The resonant tunneling device of claim 9, wherein the substrate serves as a gate electrode, and the second insulating layer serves as a gate insulating layer.

11. The resonant tunneling device of claim 1, further comprising:
    a graphene layer on at least one of the first two-dimensional semiconductor layer or the second two-dimensional semiconductor layer.

12. The resonant tunneling device of claim 1, wherein the resonant tunneling device is configured to detect one or more physical properties of the first two-dimensional semiconductor material and the second two-dimensional semiconductor material based on a negative differential resistance (NDR) effect.

13. The resonant tunneling device of claim 12, wherein the physical properties include an electronic structure, a bandgap, or a quantum capacitance.

14. The resonant tunneling device of claim 12, wherein the resonant tunneling device is configured to detect a temperature, a wavelength of light or an intensity of light based on the NDR effect.

15. A method of detecting physical properties using a resonant tunneling device that includes a first two-dimensional semiconductor layer, the first two-dimensional semiconductor layer including a first two-dimensional semiconductor material, a first insulating layer on the first two-dimensional semiconductor layer, and a second two-dimensional semiconductor layer on the first insulating layer and including a second two-dimensional semiconductor material of a same kind as the first two-dimensional semiconductor material, wherein a crystal lattice of the first two-dimensional semiconductor material and a crystal lattice of the second two-dimensional semiconductor material are aligned with each other, the method comprising:

causing the resonant tunneling device to detect one or more physical properties of the first and second two-dimensional semiconductor materials, based on a negative differential resistance (NDR) effect.

16. The method of claim 15, wherein
the physical properties include an electronic structure, a bandgap, or a quantum capacitance.

17. The method of claim 16, wherein
the physical properties are the bandgap, and
the bandgap is detected using the NDR effect generated according to a gate voltage in the resonant tunneling device.

18. A method of detecting physical properties using a resonant tunneling device that includes a first two-dimensional semiconductor layer, the first two-dimensional semiconductor layer including a first two-dimensional semiconductor material; a first insulating layer on the first two-dimensional semiconductor layer; and a second two-dimensional semiconductor layer provided on the first insulating layer and including a second two-dimensional semiconductor material of a same kind as the first two-dimensional semiconductor material, wherein a crystal lattice of the first two-dimensional semiconductor material and a crystal lattice of the second two-dimensional semiconductor material are aligned with each other, the method comprising:

causing the resonant tunneling device to detect one or more of a temperature, a wavelength of light incident on the resonant tunneling device, or an intensity of the light incident on the resonant tunneling device, based on a negative differential resistance (NDR) effect.

19. The method of claim 18, wherein
the temperature is detected using the NDR effect generated according to the temperature in the resonant tunneling device.

20. The method of claim 18, wherein
the wavelength of the light incident on the resonant tunneling device or the intensity of the light incident on the resonant tunneling device is detected using the NDR effect generated according to the light incident on the resonant tunneling device.

21. A resonant tunneling device, comprising:
a first two-dimensional semiconductor layer including a first two-dimensional semiconductor material;
a first insulating layer on the first two-dimensional semiconductor layer; and
a second two-dimensional semiconductor layer on the first insulating layer, the second two-dimensional semiconductor layer including a second two-dimensional semiconductor material of a same kind as the first two-dimensional semiconductor material,
wherein a crystal lattice of the first two-dimensional semiconductor material and a crystal lattice of the second two-dimensional semiconductor material are aligned with each other, such that the first two-dimensional semiconductor material and the second two-dimensional semiconductor material are configured to have respective energy bands that are aligned with each other.

22. The resonant tunneling device of claim 21, wherein
the first two-dimensional semiconductor material and the second two-dimensional semiconductor material each include a same transition metal dichalcogenide (TMD).

23. The resonant tunneling device of claim 22, wherein
the same TMD is expressed by <Equation 1>, $$M_{1-a}M_a'X_{2(1-b)}X_{2b}' \qquad \text{<Equation 1>}$$

wherein, in <Equation 1>, M and M' are different transition metal elements, X and X' are different chalcogen elements, $0 \le a < 1$, and $0 \le b < 1$.

24. The resonant tunneling device of claim 23, wherein
M and M' are different from each other, and M and M' each include at least one of Ti, Zr, Hf, V, Nb, Ta, Mo, W, Tc, Re, Co, Rh, Ir, Ni, Pd, Pt, Zn, or Sn, and
X and X' are different from each other, and X and X' each include at least one of S, Se or Te.

25. The resonant tunneling device of claim 21, wherein
the first insulating layer includes a two-dimensional insulating material or an oxide material.

26. The resonant tunneling device of claim 21, further comprising:
a first electrode electrically connected to the first two-dimensional semiconductor layer; and
a second electrode electrically connected to the second two-dimensional semiconductor layer.

27. The resonant tunneling device of claim 21, further comprising:
a substrate, wherein the first two-dimensional semiconductor layer is on the substrate.

28. The resonant tunneling device of claim 27, wherein
the substrate includes an insulating material.

29. The resonant tunneling device of claim 21, further comprising:
a second insulating layer, wherein the first two-dimensional semiconductor layer is on the second insulating layer; and
a substrate, wherein the second insulating layer is on the substrate and includes an electrically conductive material.

30. The resonant tunneling device of claim 29, wherein
the substrate serves as a gate electrode, and the second insulating layer serves as a gate insulating layer.

31. The resonant tunneling device of claim 21, further comprising:
a graphene layer on at least one of the first two-dimensional semiconductor layer or the second two-dimensional semiconductor layer.

32. A system, comprising:
the resonant tunneling device of claim 21;
a power supply; and
processing circuitry configured to
control an application of voltage to at least one of the first two-dimensional semiconductor layer or the second two-dimensional semiconductor layer of the resonant tunneling device to cause the resonant tunneling device to perform at least one of
detecting one or more physical properties of the first and second two-dimensional semiconductor materials, based on a negative differential resistance (NDR) effect, or
detecting one or more of a temperature, a wavelength of light incident on the resonant tunneling device, or an intensity of the light incident on the resonant tunneling device, based on a negative differential resistance (NDR) effect.

* * * * *